(12) United States Patent
Togami

(10) Patent No.: US 10,546,952 B2
(45) Date of Patent: Jan. 28, 2020

(54) SEMICONDUCTOR DEVICE AND MANUFACTURING METHOD THEREOF

(71) Applicant: Renesas Electronics Corporation, Koutou-ku, Tokyo (JP)

(72) Inventor: Tetsuji Togami, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/162,347

(22) Filed: Oct. 16, 2018

(65) Prior Publication Data
US 2019/0051746 A1 Feb. 14, 2019

Related U.S. Application Data

(62) Division of application No. 15/640,500, filed on Jul. 1, 2017, now Pat. No. 10,121,888.

(30) Foreign Application Priority Data

Sep. 23, 2016 (JP) .................................. 2016-185314

(51) Int. Cl.
*H01L 29/66* (2006.01)
*H01L 29/78* (2006.01)
(Continued)

(52) U.S. Cl.
CPC .... *H01L 29/7813* (2013.01); *H01L 21/30604* (2013.01); *H01L 21/76895* (2013.01); *H01L 21/78* (2013.01); *H01L 21/823475* (2013.01); *H01L 27/0207* (2013.01); *H01L 27/088* (2013.01); *H01L 29/0882* (2013.01); *H01L 29/41741* (2013.01); *H01L 29/66712* (2013.01); *H01L 24/16* (2013.01); *H01L 24/32* (2013.01); *H01L 24/48* (2013.01); *H01L 24/73* (2013.01); *H01L 29/4236* (2013.01); *H01L 2224/16227* (2013.01); *H01L 2224/32245* (2013.01); *H01L 2224/48106* (2013.01);
(Continued)

(58) Field of Classification Search
CPC ............. H01L 29/7813; H01L 29/4236; H01L 29/66712; H01L 29/0882; H01L 29/41741
See application file for complete search history.

(56) References Cited

U.S. PATENT DOCUMENTS

2001/0045635 A1\* 11/2001 Kinzer ................ H01L 23/3114
257/685
2002/0179945 A1\* 12/2002 Sakamoto ......... H01L 23/49562
257/288

FOREIGN PATENT DOCUMENTS

JP   2006-156658 A   6/2006
JP   2011-035322 A   2/2011

\* cited by examiner

*Primary Examiner* — Stephen M Bradley
*Assistant Examiner* — Wasiul Haider
(74) *Attorney, Agent, or Firm* — Shapiro, Gabor and Rosenberger, PLLC

(57) ABSTRACT

The present invention provides a method of manufacturing a semiconductor device to improve the manufacturing yield of the semiconductor device. The manufacturing method includes the steps of: forming a groove extending in a first direction (y direction) across a first power transistor formation region and a second power transistor formation region, in a back surface of a semiconductor wafer; filling the groove with a conductor film by forming the conductor film on the back surface in which the groove is formed; and exposing the back surface of the semiconductor wafer by removing a portion of the conductor film.

5 Claims, 27 Drawing Sheets

(51) Int. Cl.
    *H01L 27/02*     (2006.01)
    *H01L 29/417*    (2006.01)
    *H01L 29/08*     (2006.01)
    *H01L 21/8234*   (2006.01)
    *H01L 21/78*     (2006.01)
    *H01L 21/306*    (2006.01)
    *H01L 21/768*    (2006.01)
    *H01L 27/088*    (2006.01)
    *H01L 29/423*    (2006.01)
    *H01L 23/00*     (2006.01)

(52) U.S. Cl.
    CPC ................ *H01L 2224/48247* (2013.01); *H01L 2224/73265* (2013.01); *H01L 2924/13091* (2013.01); *H01L 2924/14* (2013.01)

< WITH WARP >

< WITH WARP >

< WITHOUT WARP >

< SMALL EFFECT OF REDUCING WARP >

< LARGE EFFECT OF REDUCING WARP >

SEMICONDUCTOR DEVICE AND MANUFACTURING METHOD THEREOF

CROSS-REFERENCE TO RELATED APPLICATIONS

The disclosure of Japanese Patent Application No. 2016-185314 filed on Sep. 23, 2016 including the specification, drawings and abstract is incorporated herein by reference in its entirety.

BACKGROUND

The present invention relates to a semiconductor device and its manufacturing techniques. Specifically, for example, the present invention relates to techniques that are effective when applied to a semiconductor device including a first power transistor and a second power transistor that are reversely coupled in series to each other in the same semiconductor chip, as well as applied to its manufacturing techniques.

Japanese Unexamined Patent Application Publication No. 2011-35322 (Patent Document 1) describes a technique to form a back electrode so that it is embedded within a concave portion in a back surface of a semiconductor substrate and covers at least part of the area except the concave portion in the back surface of the semiconductor substrate.

Japanese Unexamined Patent Application Publication No. 2006-156658 (Patent Document 2) describes a technique to form a back electrode in a bottom surface of a groove that is provided in a back surface of an SiC substrate, and to form a conductor so as to fill the groove.

SUMMARY

For example, there is a technique to form a first power transistor and a second power transistor that are reversely coupled in series to each other in a single semiconductor chip. A drain electrode, which is common to the first power transistor and the second power transistor, is formed in a back surface of the semiconductor chip.

Here, in order to reduce the ON resistance of the semiconductor device, the film thickness of the drain electrode formed in the back surface of the semiconductor chip is increased.

However, recently the thickness of the semiconductor chip has tended to be reduced. Then, according to the studies of the present inventors, in the process of manufacturing the single semiconductor chip described above in which a semiconductor wafer is used and a plurality of semiconductor chips are formed in the single semiconductor wafer, it has been newly found that the semiconductor wafer may be warped when the film thickness is increased. In other words, when the film thickness of the drain electrode formed in the back surface of the semiconductor chip is increased, the warp of the semiconductor wafer in the manufacturing process of the semiconductor chip becomes a problem.

These and other objects and novel features of the present invention will become more apparent from the following detailed description, taken in conjunction with the accompanying drawings.

The manufacturing method of a semiconductor device in an embodiment includes the steps of: forming a groove that extends in a first direction across a first power transistor formation region and a second power transistor formation region in aback surface of a semiconductor wafer; and exposing the back surface of the semiconductor wafer by removing a portion of a conductor film.

According to an embodiment, it is possible to improve the manufacturing yield of semiconductor devices.

DETAILED DESCRIPTION

Figure 1:
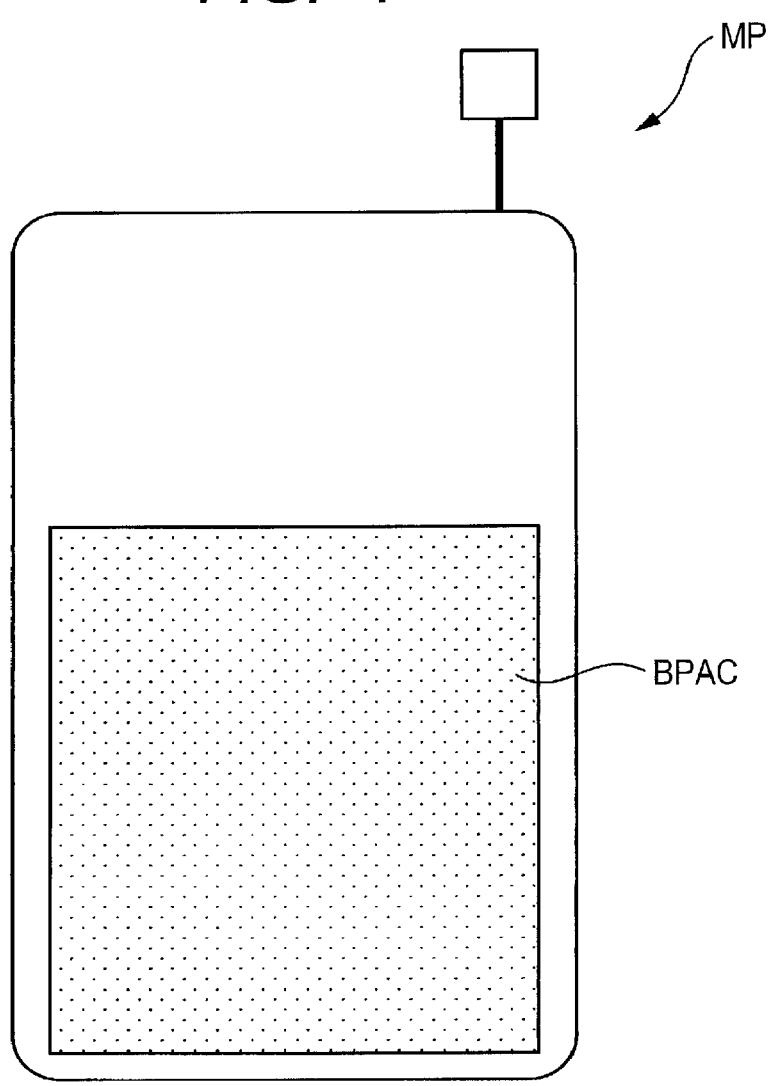
FIG. 1 is a plan view of a mobile phone (smart phone) as seen from the back side.

In the embodiment described below, the detailed description of the invention will be divided into a plurality of sections or embodiments when required as a matter of convenience. However, these sections or embodiments are not irrelevant to each other unless otherwise stated, and one serves as a variation, a detailed description, or a supplementary explanation of a part or the whole of the other.

Also, in the embodiment described below, when referring to the number of elements (including the number of pieces, numerical value, amount, range, etc.), the number of elements is not limited to a specific number unless otherwise stated or unless it is clearly limited to a specific number in principle. The number of elements can be greater or smaller than the specific number.

Further, it goes without saying that in the embodiment described below, the components (including operation steps, etc.) are not necessarily required, unless otherwise stated or unless they are clearly needed in principle.

Similarly, in the embodiment described below, when referring to the shape, the positional relationship, or other characteristics of the components, those practically approximating or corresponding to the shape or other characteristics are included unless otherwise stated or unless it is clearly not so in principle. This is true for values and ranges.

Further, in all drawings for explaining the embodiments, the same components are identified by the same reference numerals in principle, and the repetitive description thereof will be omitted. Note that hatching may be used also in the plan view to make the figure easy to understand.

<Explanation of Terms>

The term "power transistor" in the present specification means a collection of unit transistors in which a plurality of unit transistors (cell transistors) are coupled in parallel (for example, thousands to hundreds of thousands of unit transistors are coupled in parallel) to achieve the function of each unit transistor also with a current greater than the allowable current of the unit transistor. For example, when a unit transistor functions as a switching element, the "power transistor" is a switching element that can also be applied to a current greater than the allowable current of the unit transistor.

<External Configuration of Mobile Phone>

FIG. 1 is a plan view of a mobile phone (smart phone) MP as seen from the back side. As shown in FIG. 1, the mobile phone MP according to the present embodiment has a substantially rectangular shape, in which a battery back BPAC including a power supply to operate the mobile phone MP is built into the back of the mobile phone MP. For example, the battery pack BPAC has a secondary battery that can be charged and discharged. The secondary battery functions as the power supply to operate the mobile phone MP. Further, the battery back BPAC can be removed from the mobile phone MP, allowing the user to easily replace the battery pack BPAC with a new one if the performance of the battery pack BPAC is deteriorated.

<General Configuration of Battery Pack>

Figure 2:
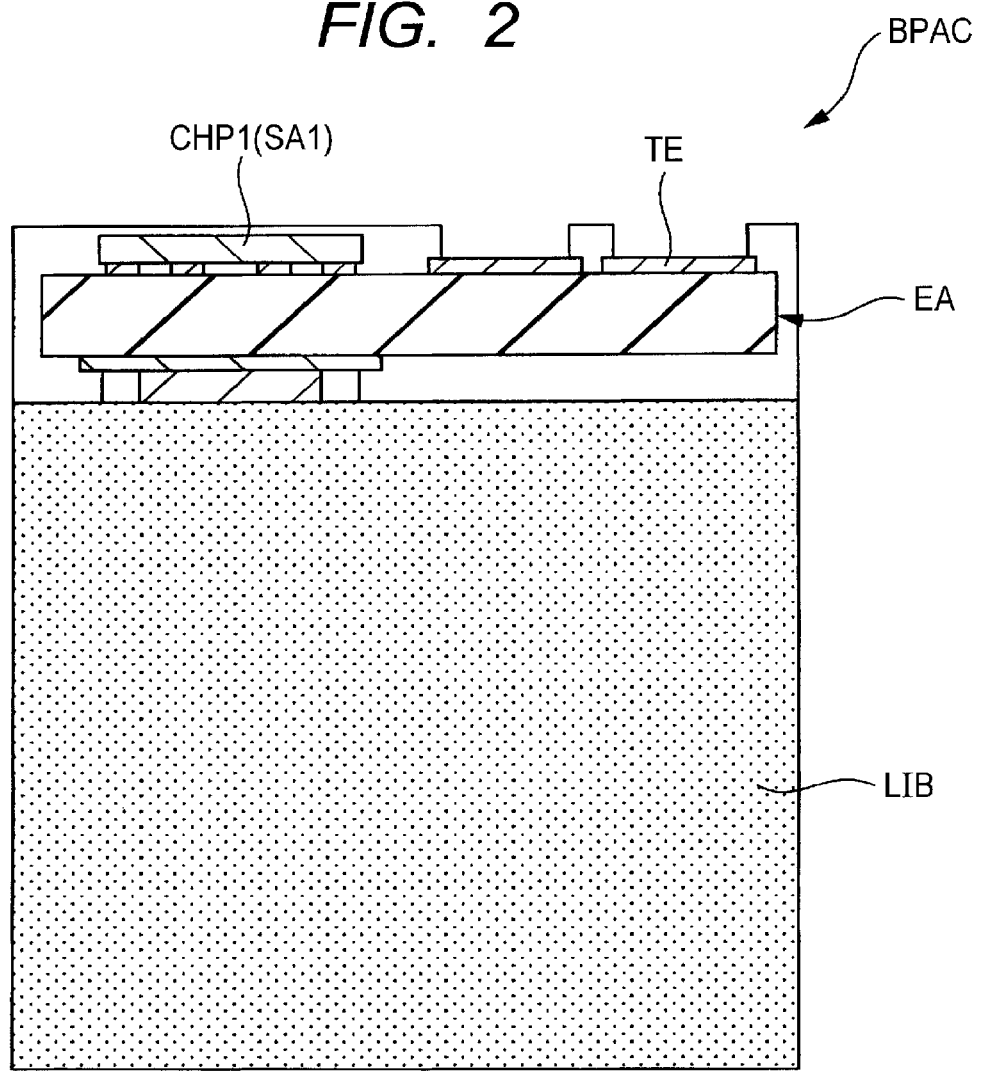
FIG. 2 is a schematic view showing the general configuration of a battery pack.

FIG. 2 is a schematic view showing the general configuration of the battery pack BPAC. As shown in FIG. 2, for example, the battery pack BPAC is provided with a lithium ion battery LIB, which is an example of a secondary battery that can be charged and discharged, as well as an electronic apparatus EA. The lithium ion battery LIB and the electronic apparatus EA are electrically coupled. Then, as shown in FIG. 2, the electronic apparatus EA includes a semiconductor chip CHP1 (semiconductor device SA1) in which a power transistor is formed, a control chip (not shown) in which an integrated circuit is formed, and electronic components (not shown) such as a capacitor (capacitive element) and a resistance element. At this time, the control chip functions as a control unit that controls the charge and discharge of the lithium ion battery LIB. The semiconductor chip CHP1 is electrically coupled to the control unit to function as a bidirectional connection through which the charge/discharge current flows. Then, an external connection terminal TE that can be coupled to the outside is formed in the electronic apparatus EA. The external connection terminal TE formed in the electronic apparatus EA is coupled to the mobile phone body, and thus it is possible to supply power to the mobile phone body from the battery pack BPAC. The battery back BPAC is generally configured as described above.

<Availability of Bidirectional Connection>

As described above, the battery pack BPAC includes the semiconductor chip CHP1 that functions as the bidirectional connection. The availability of the bidirectional connection formed in the semiconductor chip CHP1 will be described below. The bidirectional connection is used to allow the current to flow in two directions. For example, the bidirectional connection is configured with the semiconductor chip CHP1 in which a power transistor is formed, as a semiconductor component to allow the charge/discharge current of the secondary battery to flow.

Figure 3:
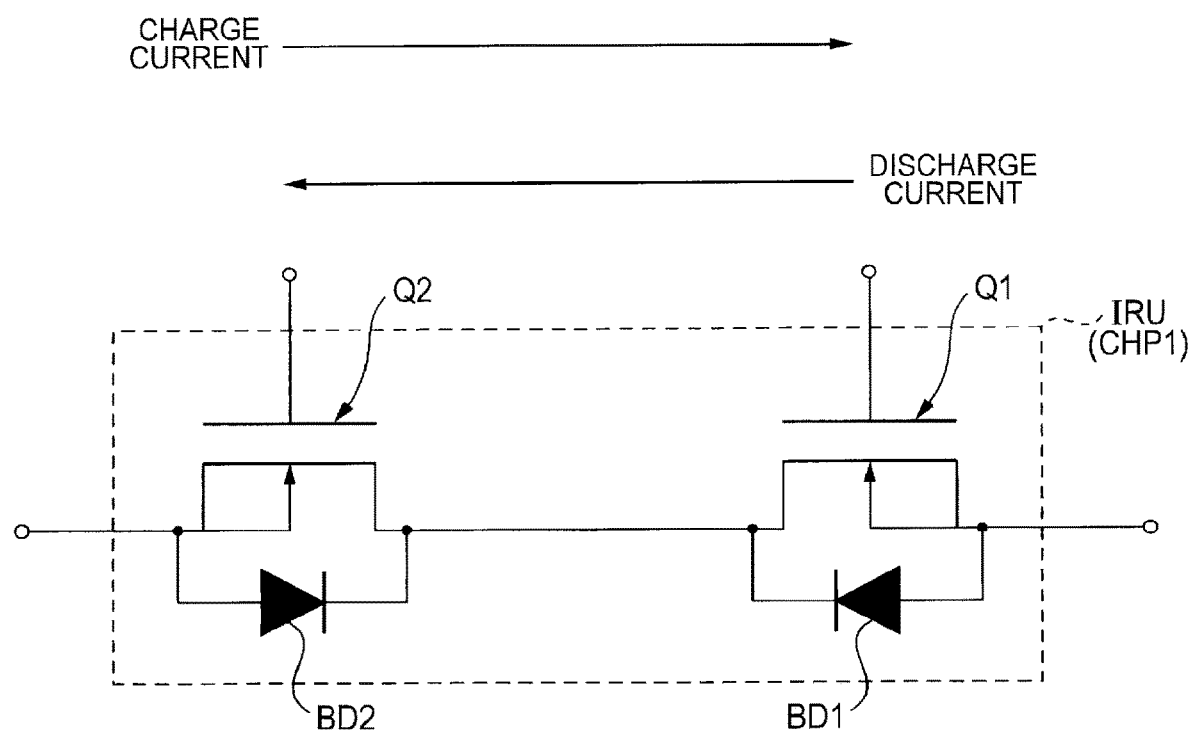
FIG. 3 is a circuit diagram showing a simple circuit configuration of a bidirectional connection formed in a semiconductor chip.

FIG. 3 is a circuit diagram showing a simple circuit configuration of a bidirectional connection IRU formed in the semiconductor chip CHP1. In FIG. 3, for example, the bidirectional connection IRU has a configuration in which a power transistor Q1 of an n-channel field effect transistor and a power transistor Q2 of an n-channel field effect transistor are reversely coupled in series. In other words, in the bidirectional connection IRU, the power transistor Q1 and the power transistor Q2 are coupled in such a way that the drain of the power transistor Q1 and the drain of the power transistor Q2 are electrically coupled to each other. In other words, it can also be said that the power transistor Q1 is coupled to the power transistor Q2 in such a way that the cathode of a body diode BD1 that is parasitically formed in the power transistor Q1 is electrically coupled to the cathode of a body diode BD2 that is parasitically formed in the power transistor Q2. For example, as shown in FIG. 3, the bidirectional connection IRU configured as described above allows the discharge current to flow from the right side to the left side, and at the same time, allows the charge current to flow from the left side to the right side. In other words, the discharge current and the charge current flow in the direction opposite to each other through the bidirectional connection IRU.

Here, for example, considering the case in which the bidirectional connection IRU is configured with only the power transistor Q1. In this case also, the discharge current and the charge current may flow when the power transistor Q1 is turned on. However, when the bidirectional connection IRU is configured with only the power transistor Q1, even if the power transistor is turned off so as to stop the discharge current, the discharge current will continue to flow through the body diode BD1 that is parasitically formed in the power transistor Q1. In this way, when the bidirectional connection IRU is configured with only the power transistor Q1, there is a problem of not being able to stop the discharge current. On the other hand, when the bidirectional connection IRU is configured with only the power transistor Q2, even if the power transistor Q2 is turned off so as to stop the charge current, the charge current will continue to flow through the body diode BD2 that is parasitically formed in the power transistor Q2. In this way, when the bidirectional connection IRU is configured with only the power transistor Q2, there is a problem of not being able to stop the charge current.

Thus, in order to solve the problems described above, as shown in FIG. 3, the bidirectional connection IRU includes both the power transistor Q1 and the power transistor Q2 in such a way that the power transistor Q1 and the power transistor Q2 are reversely coupled in series. With this configuration, it is possible to perform control to stop the discharge current and the charge current.

The reason will be described below. In FIG. 3, the discharge current flows when the power transistor Q1 is turned on and the power transistor Q2 is turned on. Then, in order to stop the discharge current, the power transistor Q1 and the power transistor Q2 are turned off. At this time, even if the power transistor Q1 is turned off, the discharge current continues to flow through the body diode BD1 that is parasitically present in the power transistor Q1. However, the bidirectional connection IRU shown in FIG. 3 has the power transistor Q2 that is reversely coupled in series to the power transistor Q1. The power transistor Q2 is turned off while the body diode BD2 that is parasitically formed in the power transistor Q2 is made opposite to the direction in which the discharge current flows. Thus, the flow of the discharge current is blocked by the body diode BD2. In this way, the bidirectional connection IRU shown in FIG. 3 can control to stop the discharge current from flowing.

Similarly, in FIG. 3, the charge current flows when the power transistor Q1 is turned on and the power transistor Q2 is turned on. Then, in order to stop the charge current, the power transistor Q1 and the power transistor Q2 are turned off. At this time, the charge current continues to flow through the body diode BD2 that is parasitically present in the power transistor Q2, even if the power transistor Q2 is turned off. However, the bidirectional connection IRU shown in FIG. 3 has the power transistor Q1 that is reversely coupled in series to the power transistor Q2. The power transistor Q1 is turned off while the body diode BD1 that is parasitically formed in the power transistor Q1 is made opposite to the direction in which the charge current flows. As a result, the charge current is presented from flowing by the body diode BD1. In this way, the bidirectional connection IRU shown in FIG. 3 can control to stop the charge current from flowing.

According to the foregoing description, as shown in FIG. 3, by configuring the bidirectional connection IRU with the power transistor Q1 and the power transistor Q2 that are reversely coupled in series, it is possible to perform ON/OFF control of the discharge current and the charge current, respectively. In other words, it is possible to perform ON/OFF control of the discharge current and the charge current, respectively, by the bidirectional connection IRU shown in FIG. 3. The availability of the bidirectional connection IRU shown in FIG. 3 exists in this regard.

<Circuit Configuration of Battery Pack>

Figure 4:
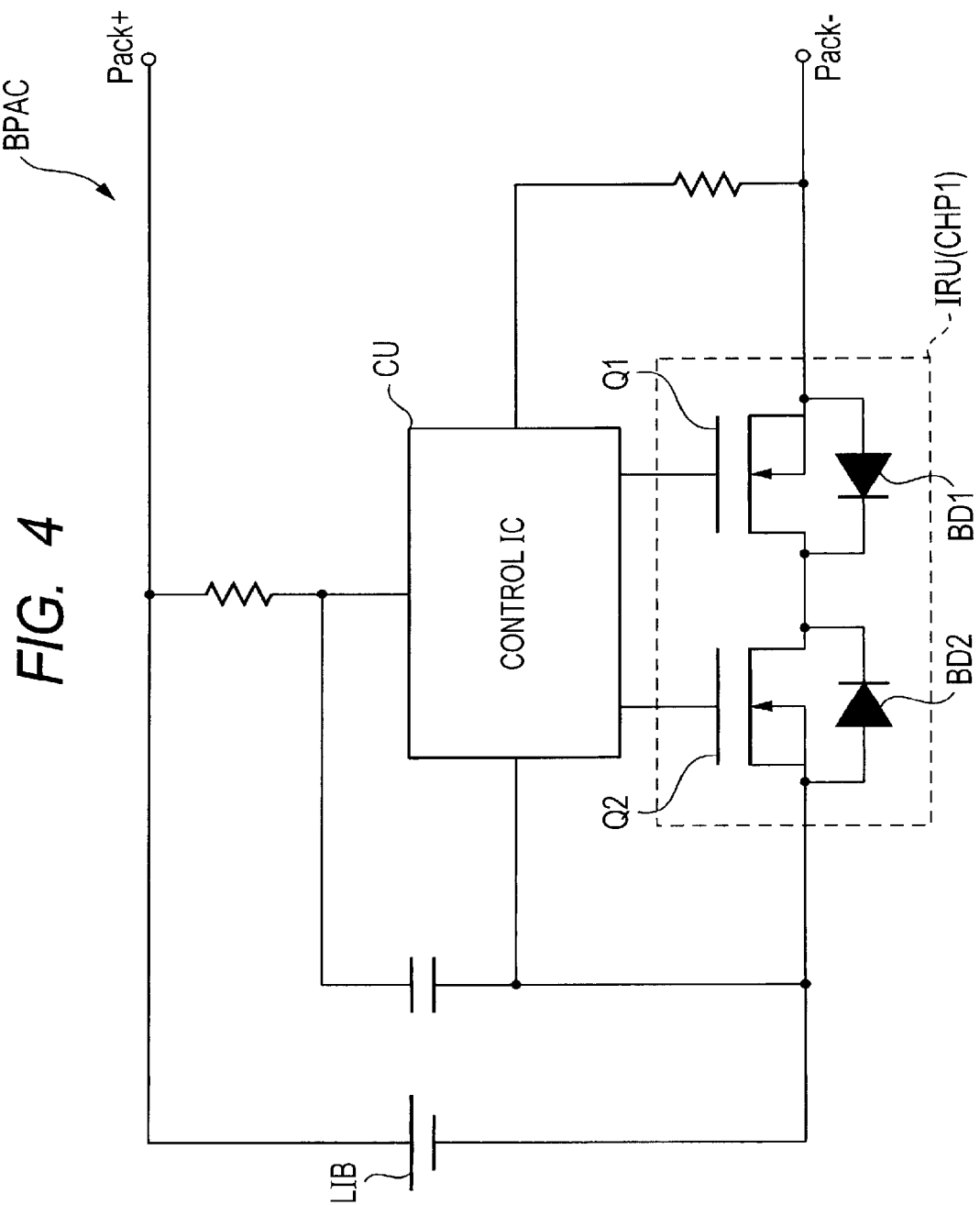
FIG. 4 is a circuit diagram showing an example of the circuit configuration of the battery pack.

Next, the circuit configuration of the battery pack BPAC including the bidirectional connection IRU described above will be described. FIG. 4 is a circuit diagram showing a circuit configuration example of the battery pack BPAC. In FIG. 4, the battery pack BPAC is provided with a lithium ion battery LIB, which is an example of a secondary battery that can be charged and discharged. The lithium ion battery LIB is electrically coupled to a control part CU that controls the charge and discharge of the lithium ion battery LIB.

Next, the lithium ion battery LIB and the bidirectional connection IRU are electrically coupled. Further, the bidirectional connection IRU is electrically coupled to a negative terminal Pack- of the battery pack BPAC. Then, the bidirectional connection IRU is configured with the power transistor Q1 and the power transistor Q2 that are reversely coupled in series to each other. The body diode BD1 is parasitically formed in the power transistor Q1, and also the body diode BD2 is parasitically formed in the power transistor Q2 in the same way.

Here, the bidirectional connection IRU and the control unit CU are electrically coupled. More specifically, the gate of the power transistor Q1 is electrically coupled to the control unit CU, and at the same time, the gate of the power transistor Q2 is electrically coupled to the control part CU. In this way, the ON/OFF of the charge/discharge current flowing through the bidirectional connection IRU is controlled by the control unit CU.

<Schematic Configuration of Semiconductor Chip>

Figure 5:
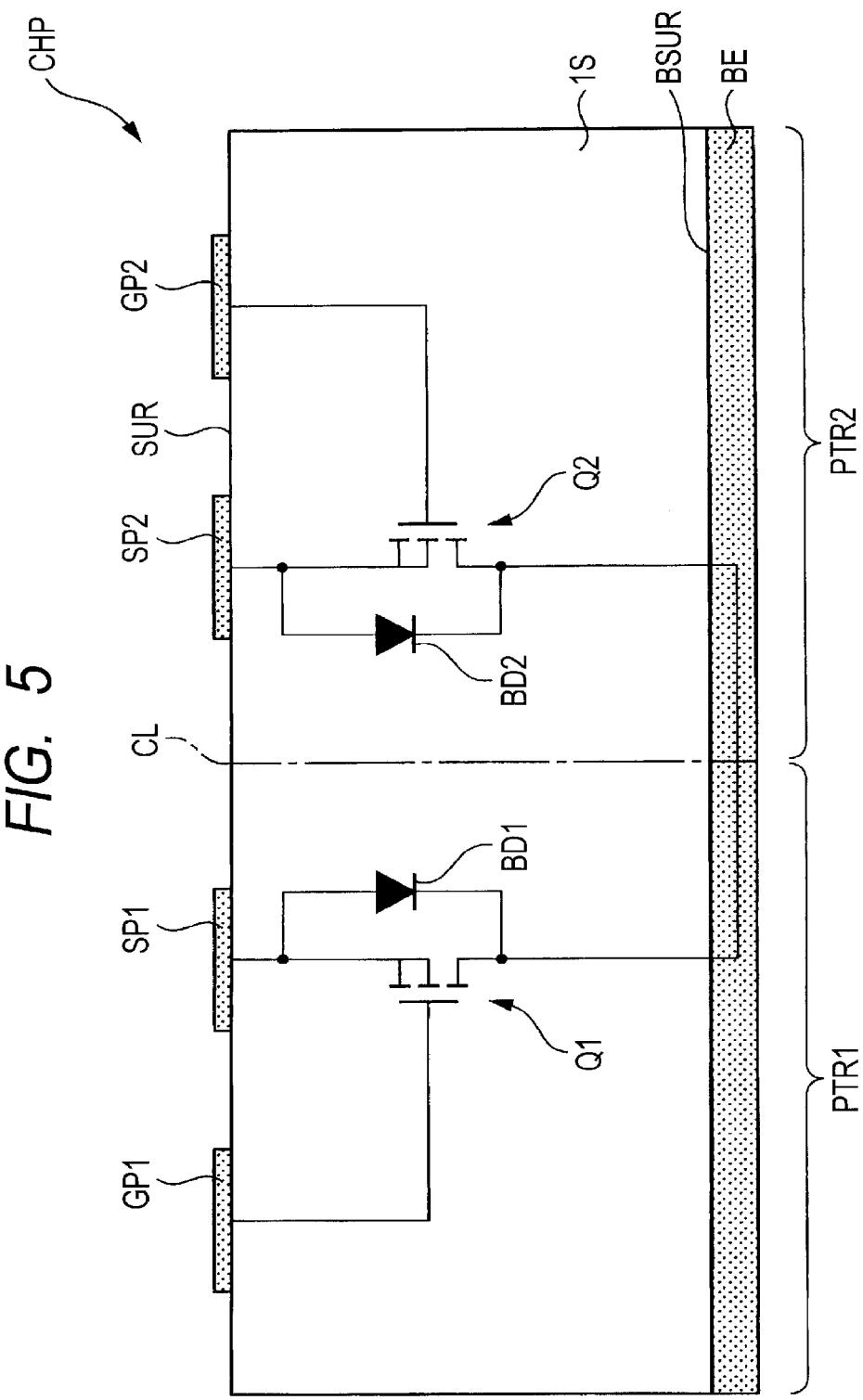
FIG. 5 is a view schematically showing the correspondence between the semiconductor chip according to a first related art and the circuit components.

FIG. 5 is a view schematically showing the correspondence between the semiconductor chip CHP and the circuit components according to a first related art. As shown in FIG. 5, the semiconductor chip CHP according to the first related art has, for example, a semiconductor substrate 1S of silicon. The power transistor Q1 of power MOSFET (Metal Oxide Semiconductor Field Effect Transistor) as well as the power transistor Q2 of power MOSFET are formed in the semiconductor substrate 1S. For example, as shown in FIG. 5, the semiconductor substrate 1S has a power transistor formation region PTR1 that is formed on the left side of the boundary CL, as well as a power transistor formation region PTR2 that is formed on the right side of the boundary CL. The power transistor Q1 is formed in the power transistor formation region PTR1. Further, the power transistor Q2 is formed in the power transistor formation region PTR2.

Then, as shown in FIG. 5, a back electrode BE is formed in the back surface of the semiconductor substrate 1S. The back electrode BE is coupled to the drain of the power transistor Q1. Further, the back electrode BE is also coupled to the drain of the power transistor Q2. In other words, the back electrode BE functions as a drain electrode that is common to the power transistor Q1 and the power transistor Q2.

On the other hand, a source pad SP1 that is electrically coupled to the source of the power transistor Q1 is formed in the surface of the semiconductor substrate 1S. Further, a gate pad GP1 that is electrically coupled to the gate of the power transistor Q1 is also formed in the surface of the semiconductor substrate 1S. Similarly, a source pad SP2 that is electrically coupled to the source of the power transistor Q2 is formed in the surface of the semiconductor substrate 1S. Further, a gate pad GP2 that is electrically coupled to the gate of the power transistor Q2 is also formed in the surface of the semiconductor substrate 1S.

Note that, as shown in FIG. 5, the body diode BD1 is parasitically formed in the power transistor Q1 that is formed in the semiconductor substrate 1S. The anode of the body diode BD1 is electrically coupled to the source of the power transistor Q1, and the cathode of the body diode BD1 is electrically coupled to the drain of the power transistor Q1. Similarly, the body diode BD2 is parasitically formed in the power transistor Q2 formed in the semiconductor substrate 1S. The anode of the body diode BD2 is electrically coupled to the source of the power transistor Q2, and the cathode of the body diode BD2 is electrically coupled to the drain of the power transistor Q2.

As described above, in the semiconductor chip CHP according to the first related art, the power transistor Q1 and the power transistor Q2 are formed in such a way that the power transistor Q1 and the transistor Q2 are reversely coupled in series. In this way, the bidirectional connection is formed in the semiconductor chip CHP.

<Study for Improvement>

Figure 6:
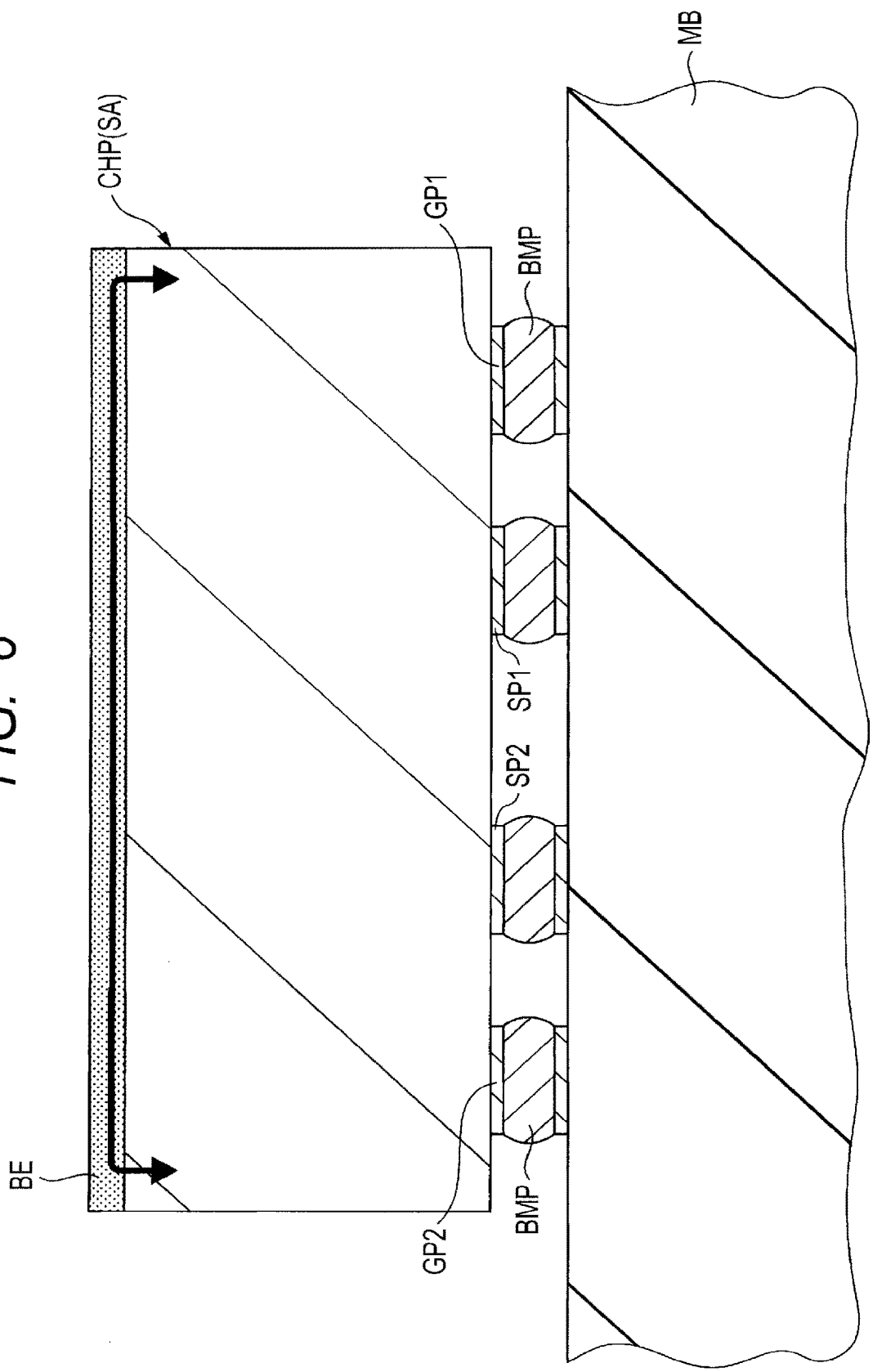
FIG. 6 is a schematic view showing the state in which the semiconductor chip according to the first related art is mounted over a mounting board.

The semiconductor chip CHP with the configuration described above with reference to FIG. 5 is mounted to the mounting board so that the surface of the semiconductor chip CHP faces the mounting board (face-down mounting). More specifically, FIG. 6 is a schematic view showing the state in which the semiconductor chip CHP according to the first related art is mounted over a mounting board MB. As shown in FIG. 6, the semiconductor chip CHP (semiconductor device SA) is mounted over the mounting board MB in such a way that the back electrode BE, which is formed in the back surface of the semiconductor chip CHP, faces upward. At this time, the gate pad GP1, the source pad SP1, the source pad SP2, and the gate pad GP2, which are formed on the surface side of the semiconductor chip CHP, are electrically coupled to a terminal formed in the surface of the mounting board MB, respectively, through a bump electrode BMP.

In the semiconductor chip CHP configured as described above, the charge/discharge current flows as indicated by the arrows in FIG. 6 through the back electrode BE facing upward. Thus, in the case of face-down mounting such as shown in FIG. 6, it is necessary to increase the thickness of the back electrode BE formed of a metal film, in order to reduce the ON resistance of the semiconductor chip CHP. In other words, the semiconductor chip CHP according to the first related art is based on the assumption that the semiconductor chip CHP is mounted facing down to the mounting board MB. In other words, this is because the semiconductor chip CHP is mounted facing down to the mounting board MB, the necessity to increase the thickness of the back electrode BE arises in order to reduce the ON resistance.

Figure 7:
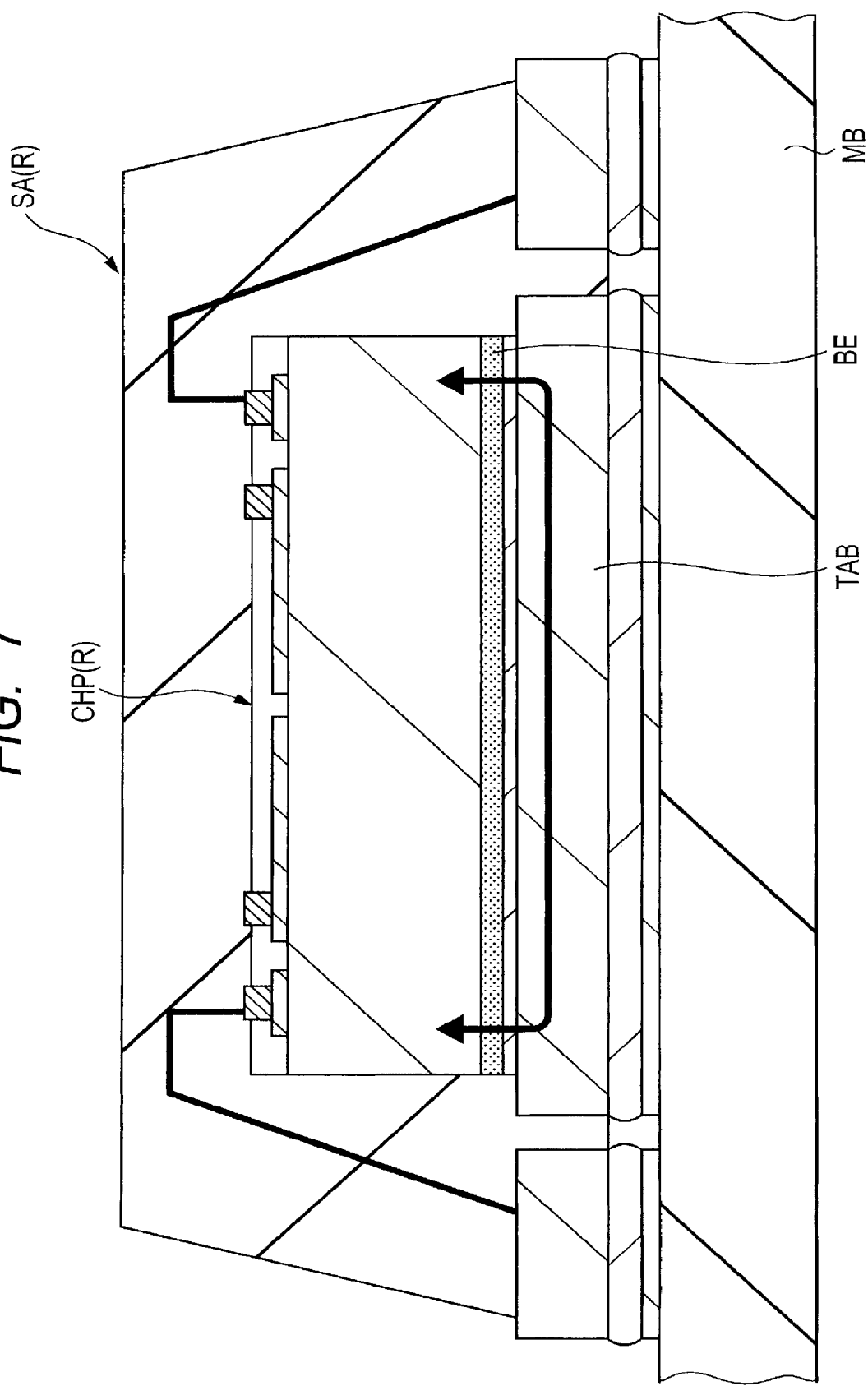
FIG. 7 is a schematic view showing the state in which a semiconductor device according to a second related art is mounted to a mounting board.

On the other hand, for example, FIG. 7 is a schematic view showing the state in which a semiconductor device SA(R) according to a second related art is mounted to the mounting board MB. As shown in FIG. 7, the semiconductor device SA (R) has a chip mounting portion TAB. The semiconductor chip CHP(R) is mounted over the chip mounting portion TAB in such a way that the back electrode BE is brought into contact with the semiconductor chip CHP(R). Then, the semiconductor device SA(R) according to the second related art is mounted to the mounting board MB. In the semiconductor chip CHP(R) according to the second related art that is configured as described above, the charge/discharge current flows as indicated by the arrows in FIG. 7, through the chip mounting portion TBA in which the semiconductor device SA (R) is mounted. Thus, in the case of face-up mounting such as shown in FIG. 7, the charge/discharge current mainly flows through the chip mounting portion TAB which is thick and has a low resistance. This reduces the ON resistance of the current path through which the charge/discharge current flows, so that there is no need to increase the thickness of the back electrode BE.

As described above, in the first related art, this is because the semiconductor chip CHP is mounted facing down to the mounting board MB, the necessity to increase the thickness of the back electrode BE arises in order to reduce the ON resistance (see FIG. 6). In other words, when the semiconductor chip CHP(R) is mounted facing down over the chip mounting portion TAB, the ON resistance is reduced by the chip mounting portion TAB, so that there is no need to increase the thickness of the back electrode BE in order to reduce the ON resistance. Note that also in the case of mounting the semiconductor chip facing up to a wiring substrate (BGA), it is possible to reduce the ON resistance by increasing the thickness of the wiring of the wiring substrate that is coupled to the back electrode of the semiconductor chip, without increasing the thickness of the back electrode of the semiconductor chip.

Here, in the first related art, as shown in FIG. 6, the mounting configuration in which the semiconductor chip CHP is mounted facing down to the mounting board MB is used in order to reduce the overall size of the electronic apparatus. In other words, in the case of the semiconductor chip CHP according to the first related art shown in FIG. 6, the semiconductor chip CHP itself is the semiconductor device SA and the semiconductor SA is mounted over the mounting board MB (bare chip mounting). At this time, because the semiconductor device SA itself is configured with the semiconductor chip CHP, it is possible to reduce the size of the semiconductor device SA itself. In other words, for example, in the case of the semiconductor device SA(R) according to the second related art shown in FIG. 7, the semiconductor device SA(R) has a package configuration that covers the semiconductor chip CHP(R) with a sealing member, so that the size of the semiconductor device SA(R) is greater than the size of the semiconductor chip CHP(R) itself. This means preventing the reduction in the overall size of the electronic apparatus. From this fact, in the first related art, as shown in FIG. 6, the electronic apparatus is configured such that the semiconductor device SA is configured with the semiconductor chip CHP itself, and the semiconductor chip CHP is directory mounted to the mounting board MB. In this way, according to the first related art, it is possible to reduce the overall size of the electronic apparatus.

However, according to the studies of the present inventors, when the electronic apparatus is configured such that the semiconductor device SA is configured with the semiconductor chip CHP itself and the semiconductor chip CHP is directly mounted to the mounting substrate MB like the first related art, it has been found that although there is an advantage that it is possible to reduce the overall size of the electronic apparatus, the following adverse effect also occurs and this point will be described. That is, in the face-down mounting shown in FIG. 6, it is necessary to increase the thickness of the back electrode BE in order to reduce the ON resistance. In this case, in the manufacturing process of the semiconductor chip, the back electrode BE is formed in the back surface of the semiconductor wafer and then semiconductor wafer is diced to obtain the semiconductor chip CHP in which the back electrode BE is formed. However, in this manufacturing process of a semiconductor device, when the thickness of the back electrode BE formed in the back surface of the semiconductor wafer is increased, the semiconductor wafer is likely to be warped due to the difference in material between the silicon (Si), which is the main material of the semiconductor wafer, and the metal (for example, silver (Ag), or the like) that configures the back electrode BE. Then, when the semiconductor wafer is warped as described above, the execution of post processes such as dicing and transportation will be adversely affected and this may result in a reduction in the yield of the semiconductor device.

As described above, according to the studies of the present inventors, when the semiconductor chip CHP, in which a pair of power transistors reversely coupled in series is formed, is mounted facing down to the mounting board MB, although it is possible to reduce the overall size of the electronic apparatus, the necessity to increase the thickness of the back electrode BE arises in order to reduce the ON resistance of the semiconductor chip CHP. Then, there arises a problem that the semiconductor wafer is warped in the manufacturing process of the semiconductor device SA due to the increase in the thickness of the back electrode BE formed in the back surface of the semiconductor chip CHP. As a result, the manufacturing yield of the semiconductor device is reduced.

Thus, the present embodiment is devised to reduce the warp of the semiconductor wafer, which newly occurs as an adverse effect, while achieving downsizing of the electronic apparatus as well as reduction in the ON resistance. Hereinafter, the technical idea in the present embodiment devised as described above will be described.

<Configuration of Semiconductor Chip (Semiconductor Device)>

Figure 8:
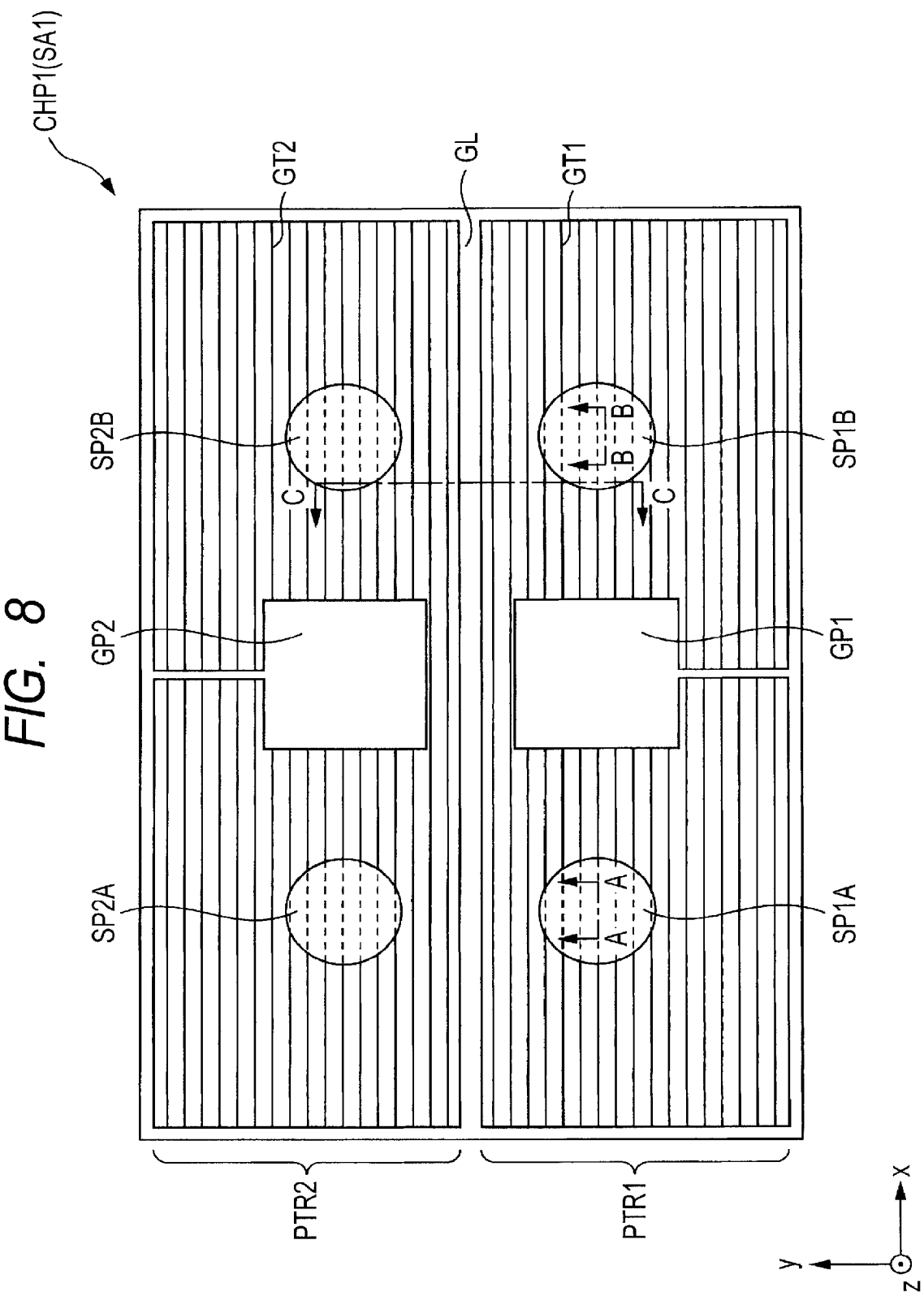
FIG. 8 is a plan view showing a schematic configuration of a semiconductor chip (semiconductor device) according to an embodiment.

FIG. 8 is a plan view showing a schematic configuration of a semiconductor chip CHP1 (semiconductor device SA1) according to the present embodiment. In FIG. 8, the semiconductor chip CHP1 in the present embodiment has, for example, a rectangular shape in a plan view, including a power transistor formation region PTR1 and a power transistor formation region PTR2 which are arranged in parallel in the y direction.

Then, as shown in FIG. 8, first in the power transistor formation region PRT1, a plurality of gates GT1 extending in the x direction are arranged in parallel in they direction. Similarly, also in the second power transistor formation region PRT2, a plurality of gates GT2 extending in the x direction are arranged in parallel in the y direction.

Further, a source pad SP1A and a source pad SP1B are separately arranged in the x direction in the surface of the power transistor formation region PTR1, in which a gate pad GP1 is provided between the source pad SP1A and the source pad SP1B. Similarly, a source pad SP2A and a source pad SP2B are separately arranged in the x direction in the surface of the power transistor formation region PTR2, in which a gate pad GP2 is provided between the source pad SP2A and the source pad SP1B.

Then, a gate line GL is formed to separate between the power transistor formation region PTR1 and the power transistor formation region PTR2. The gate line GL is electrically coupled to the gate GT1 formed in the power transistor formation region PTR1, and is also electrically coupled to the gate GT2 formed in the power transistor formation region PTR2. Further, the gate line GL is coupled to the gate pad GP1 formed in the power transistor formation region PTR1 as well as the gate pad GP2 formed in the power transistor formation region PTR2. Thus, the gate pad GP1, the gate pad GP2, the gate GT1, and the gate GT2 are electrically coupled to each other.

Figure 9:
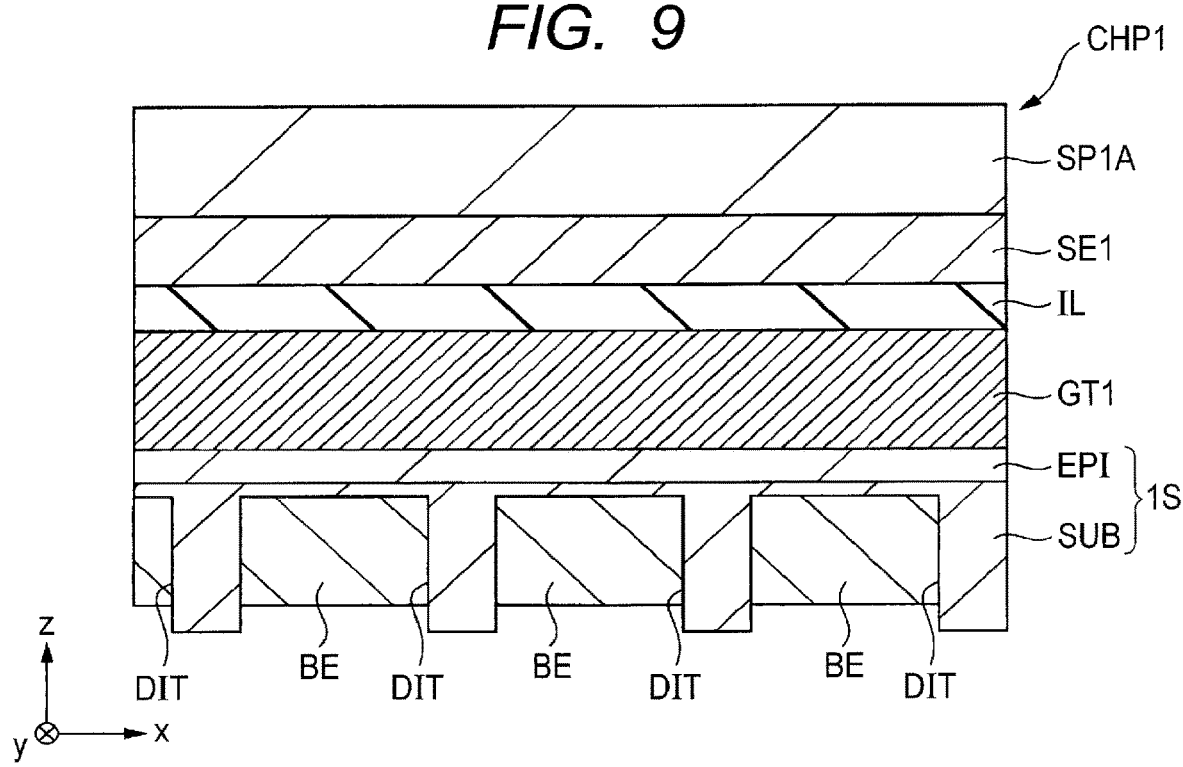
FIG. 9 is a cross-sectional view taken along line A-A of FIG. 8.

Next, FIG. 9 is a cross-sectional view taken along line A-A of FIG. 8. As shown in FIG. 9, for example, the semiconductor chip CHP1 has a semiconductor substrate 1S of silicon. The semiconductor substrate 1S includes a substrate layer SUB which is an n-type semiconductor layer, and an epitaxial layer (drift layer) EPI which is an n-type semiconductor layer formed over the substrate layer SUB. At this time, the impurity concentration of the epitaxial layer EPI is lower than the impurity concentration of the substrate layer SUB.

Figure 10:
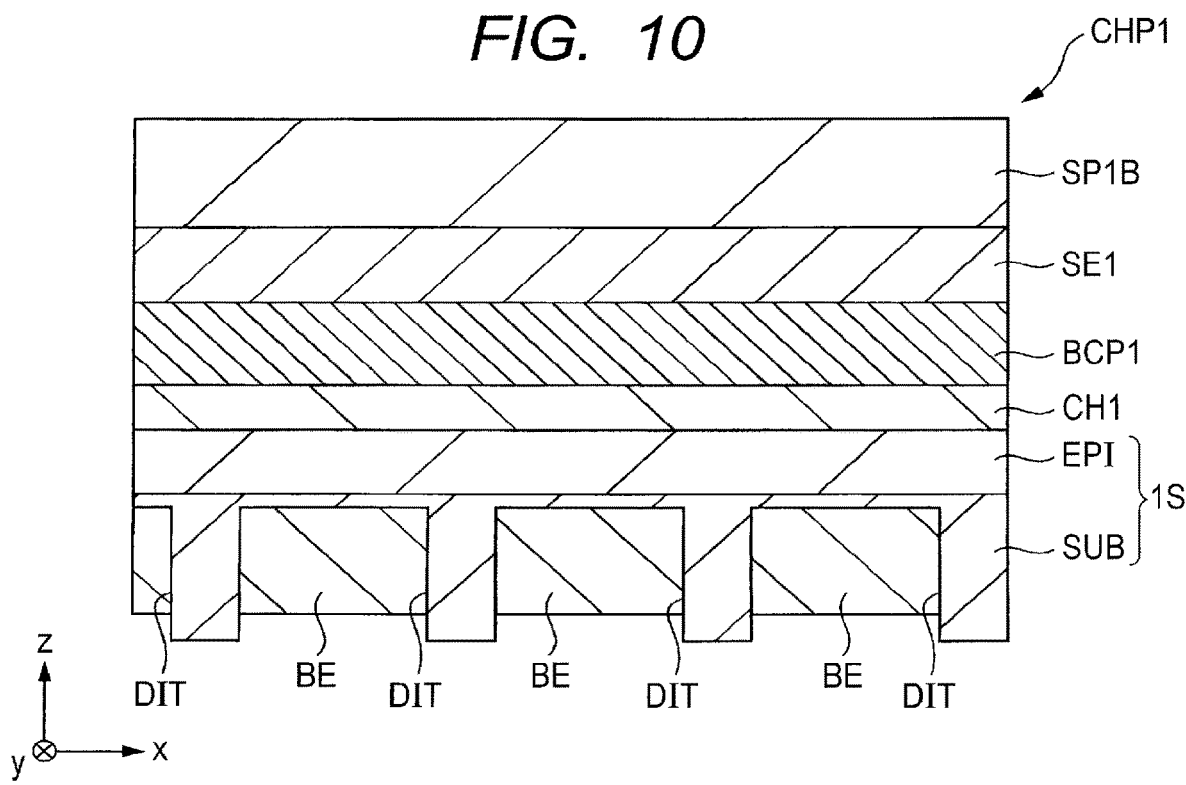
FIG. 10 is a cross-sectional view taken along line B-B of FIG. 8.

Then, as shown in FIG. 9, a plurality of grooves DIT extending in the y direction are arranged in parallel in the x direction in the substrate layer SUB. The back electrode BE configured with a laminated film of titanium film and silver film is embedded in each of the grooves DIT. Each of the grooves DIT extends in the y direction. Thus, with reference to FIG. 8, each of the grooves DIT is formed across the power transistor formation region PTR1 and the power transistor formation region PTR2 in a plan view. Then, the back electrode BE that functions as the drain electrode does not extend beyond the groove DIT. The back surface of the substrate layer SUB in which the grooves DIT are formed is exposed from the conductor film that configures the back electrode BE. The grooves DIT are formed in the substrate layer SUB, and does not reach the epitaxial layer EPI formed over the substrate layer SUB. In other words, as shown in FIGS. 9 and 10, the bottom surface that configures the groove DIT is located between the surface of the semiconductor wafer (semiconductor chip) and the back surface of the semiconductor wafer (semiconductor chip) in a cross-sectional view. More specifically, the bottom surface of the groove DIT is located between the back surface of the substrate layer SUB and the interface between the substrate layer SUB and the epitaxial layer EPI. That is to say, the bottom surface of the groove DIT is comprised of a part of the substrate layer SUB.

Next, as shown in FIG. 9, for example, the gate GT1 of a polysilicon film is formed so as to contact the epitaxial film EPI, in which the gate GT1 extends in the x direction. From this fact, in the present embodiment, the groove DIT extending in the y direction intersects the gate GT1 extending in the x direction in a plan view. For example, an interlayer insulating film IL of a silicon oxide film is formed over the gate GT1 configured as described above and, for example, a source electrode SE1 of an aluminum film is formed over the interlayer insulating film IL. Then, the source pad SP1A of an aluminum film is formed over the source electrode SE1. Thus, the source electrode SE1 and the source pad SP1A are electrically coupled to each other.

Next, FIG. 10 is a cross-sectional view taken along line B-B of FIG. 8. As shown in FIG. 10, the epitaxial layer EPI is formed over the substrate layer SUB in which the grooves DIT extending in the y direction are formed in the back surface. Then, the back electrode BE that functions as the drain electrode is for Led in each of the grooves DIT formed in the back surface of the substrate layer SUB. At the same time, a channel layer CH1, which is a p-type semiconductor layer, is formed so as to contact the epitaxial layer EP1. Then, a body contact plug BCP1 is formed so as to contact the channel layer CH1. The body contact plug BCP1 extends in the x direction intersecting the y direction, and is electrically coupled to the channel layer CH1. Further, the source electrode SE1 is formed so as to contact the body contact plug BCP1. Then, the source pad SP1B is formed over the source electrode SE1. Thus, the channel layer CH1, the body contact plug BCP1, the source electrode SE1, and the source pad SP1B are electrically coupled to each other.

Figure 11:
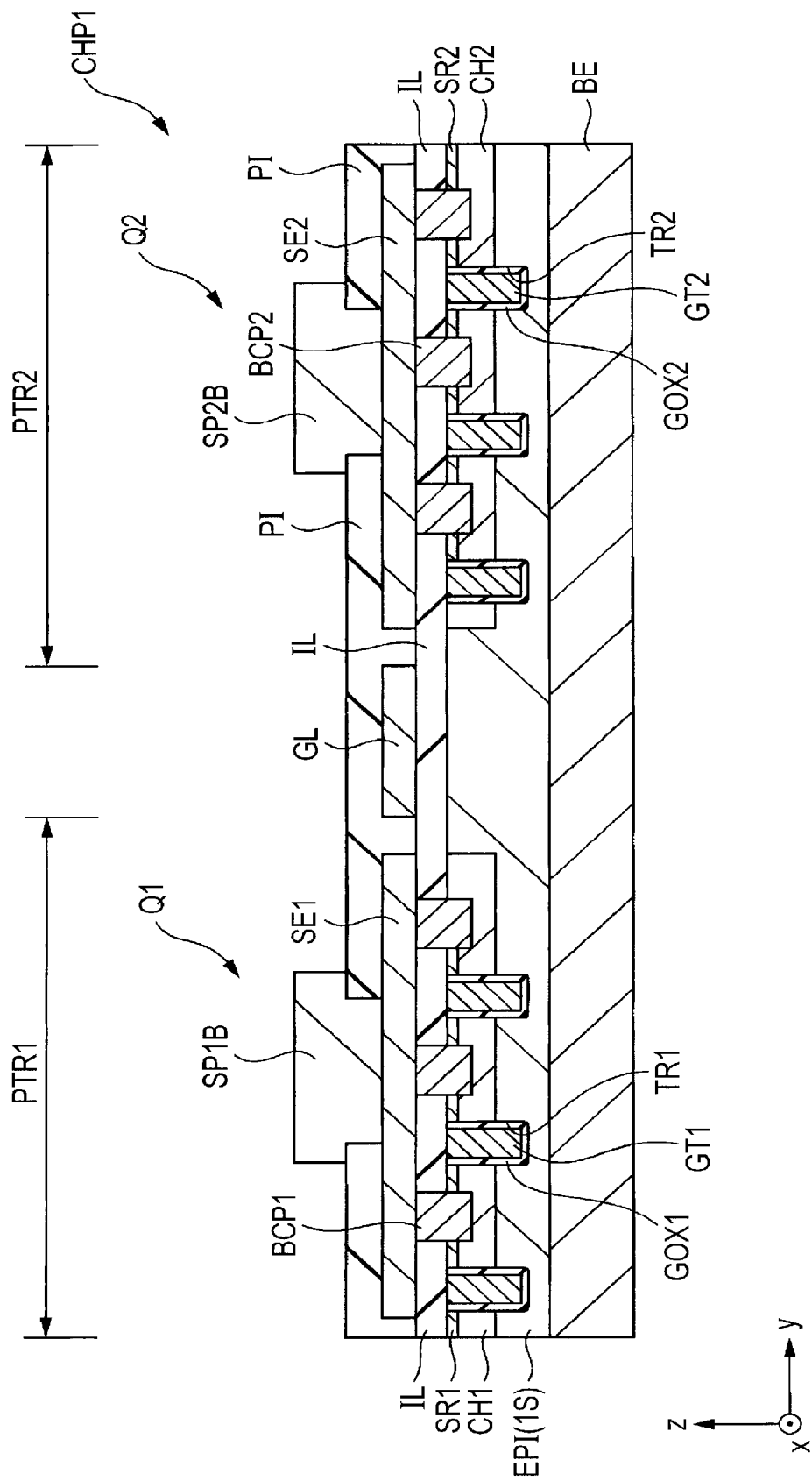
FIG. 11 is a cross-sectional view taken along line C-C of FIG. 8.

Next, FIG. 11 is a cross-sectional view taken along line C-C of FIG. 8. In FIG. 11, the semiconductor chip CHP1 has the power transistor formation region PTR1 in which the power transistor Q1 is formed, as well as the power transistor formation region PTR2 in which the power transistor Q2 is formed. Then, the semiconductor chip CHP1 has the back electrode BE extending in the y direction across the power transistor formation region PTR1 and the power transistor formation region PTR2. The back electrode BE functions as the drain electrode common to the power transistor Q1 and the power transistor Q2. In other words, in the semiconductor chip CHP1 according to the present embodiment, the power transistor Q1 and the power transistor Q2 are formed in such a way that the drain of the power transistor Q1 and the drain of the power transistor Q2 are electrically coupled to each other. That is to say, the power transistor Q1 and the power transistor Q2, which are reversely coupled in series to each other, are formed in the semiconductor chip CHP1.

Next, the epitaxial layer EPI that functions as the drain region (drain) is formed across the power transistor formation region PTR1 and the power transistor formation region PTR2. Then, the epitaxial layer EPI formed in the power transistor formation region PTR1 functions as the drain region of the power transistor Q1, and the channel layer CH1 of the power transistor Q1 is formed in the surface of the epitaxial layer EPI. Next, a trench TR1 is formed penetrating the channel layer CH1 to reach the epitaxial layer EPI, in which a gate insulating film GOX1, for example, of a silicon oxide film is formed in the inner wall of the trench TR1. Further, the gate GT1 of the power transistor Q1 formed so as to fill the trench TR1 extending in the x direction, through the gate insulating film GOX1. As a result, the gate GT1 also extends in the x direction.

Further, the source region SR1 of the power transistor Q1 is formed in a region of the surface region of the channel layer CH1, which contacts the channel layer CH1 and the trench TR1. Then, the interlayer insulating film IL is formed over the semiconductor substrate 1S including the epitaxial layer EPI, in which the body contact plug BCP1 is formed penetrating the interlayer insulating film IL to reach the channel layer CH1. The body contact plug BCP1 is formed to contact the channel layer CH1 as well as the source region SR1. The body contact plug BCP1 extends in the x direction like the gate GT1. Thus, the gate GT1 and the body contact plug BCP1 extend in parallel to each other in the x direction.

The source electrode SE1 is formed over the interlayer insulating film IL in which the body contact plug BCP1 is formed. The source electrode SE1 is electrically coupled to the body contact plug BCP1. Then, the gate line GL is also formed in the same layer as that of the source electrode SE1, in which a polyimide film PI is formed so as to cover the source electrode SE1 and the gate line GL. In the polyimide film, an opening is formed to expose a partial region of the source electrode SE1. Then, the source pad SP1B is formed so as to fill the opening and extends over the polyimide film PI. Thus, the source pad SP1B is electrically coupled to the source electrode SE1 of the lower layer through the opening formed in the polyimide film PI. In this way, the power transistor Q1 is formed in the power transistor formation region PTR1 of the semiconductor chip CHP1.

Similarly, the epitaxial layer EPI formed in the power transistor formation region PTR2 functions as the drain region of the power transistor Q2. A channel layer CH2 of the power transistor Q2 is formed in the surface of the epitaxial layer EPI. Next, a trench TR2 is formed penetrating the channel layer CH2 to reach the epitaxial layer EPI, in which a gate insulating film GOX2, for example, of a silicon oxide film is formed in the inner wall of the trench TR2. Further, the gate GT2 of the power transistor Q2 is formed so as to fill the trench TR2 extending in the x direction, through the gate insulating film GOX2. As a result, the gate GT2 also extends in the x direction.

Further, a source region (source) SR2 of the power transistor Q2 is formed in a region of the surface region of the channel layer CH2, which contacts the channel layer Ch2 and the trench TR2. Then, the interlayer insulating film IL is formed over the semiconductor substrate 1S including the epitaxial layer EPI, in which a body contact plug BCP2 is formed penetrating the interlayer insulating film IL to reach the channel layer CH2. The body contact plug BCP2 is formed to contact the channel layer Ch2 as well as the source region SR2. The body contact plug BCP2 extends in the x direction like the gate GT2. Thus, the gate GT2 and the body contact plug BCP2 extend in parallel to each other in the x direction.

A source electrode SE2 is formed over the interlayer insulating film IL in which the body contact plug BCP2 is formed. The source electrode SE2 is electrically coupled to the body contact plug BCP2. Then, the gate line GL is also formed in the same layer as that of the source electrode SE2, in which the polyimide film PI is formed so as to cover the source electrode SE2 and the gate line GL. An opening is formed in the polyimide film PI to expose a partial region of the source electrode SE2, in which the source pad SP2B is formed so as to fill the opening, extending over the polyimide film PI. Thus, the source pad SP2B is electrically coupled to the source electrode SE2 in the lower layer through the opening formed in the polyimide film IP. In this way, the power transistor Q2 is formed in the power transistor formation region PTR2 of the semiconductor chip CHP1.

<Variation>

Figure 12:
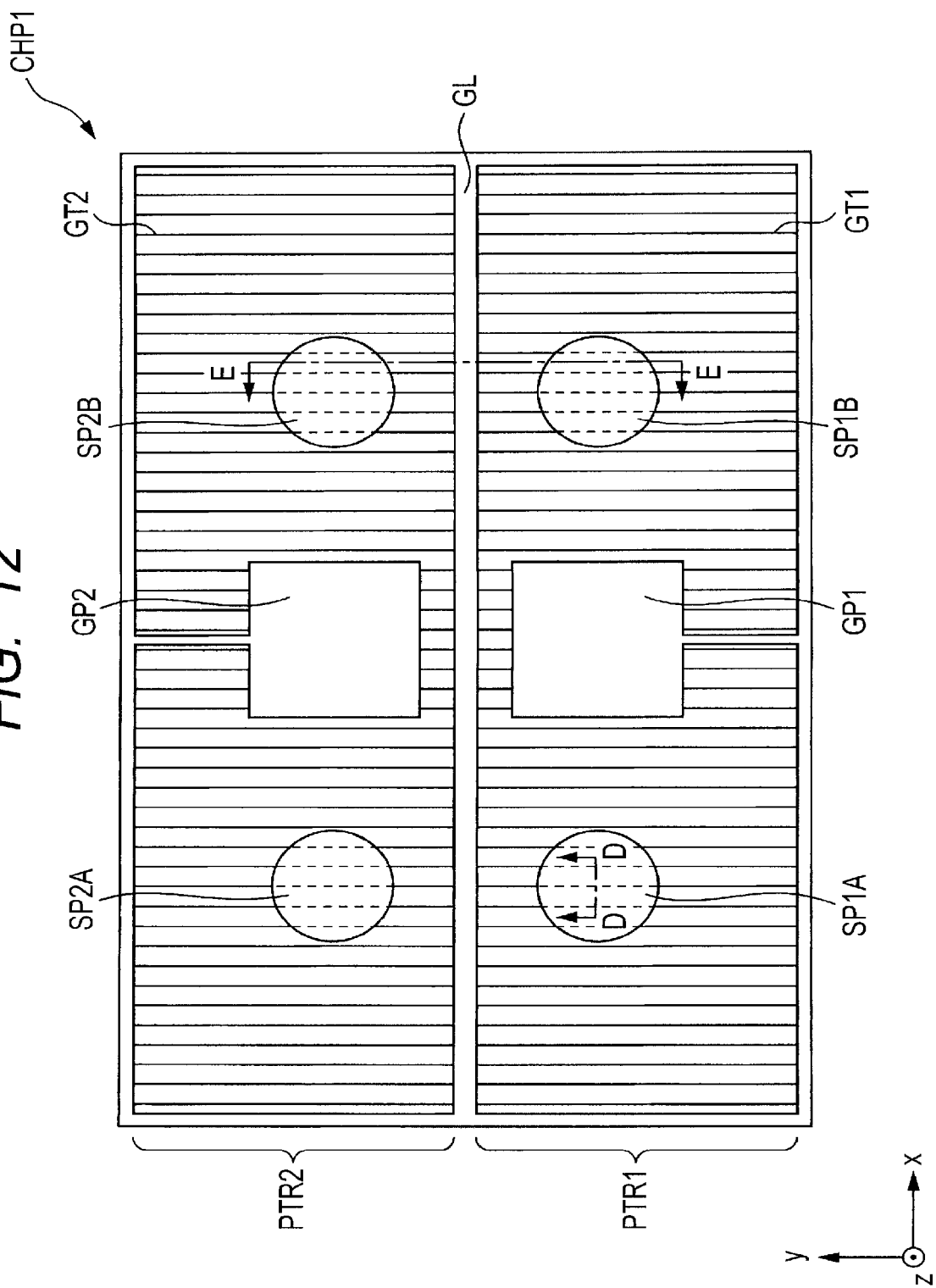
FIG. 12 is a plan view showing a schematic configuration of a semiconductor chip (semiconductor device) according to a variation.

Next, a variation of the present embodiment will be described. FIG. 12 is a plan view showing a schematic configuration of the semiconductor chip CHP1 (semiconductor device) in this variation. In FIG. 12, the semiconductor chip CHP1 in this variation is different from the semiconductor chip CHP1 in the embodiment shown in FIG. 8 in that a plurality of gates GT1 extending in the y direction are arranged in parallel in the power transistor formation region PTR1. Similarly, the semiconductor chip CHP1 in this variation is different from the semiconductor chip CHP1 in the embodiment shown in FIG. 8 in that a plurality of gates GT2 extending in the y direction are arranged in parallel in the power transistor formation region PTR2.

Figure 13:
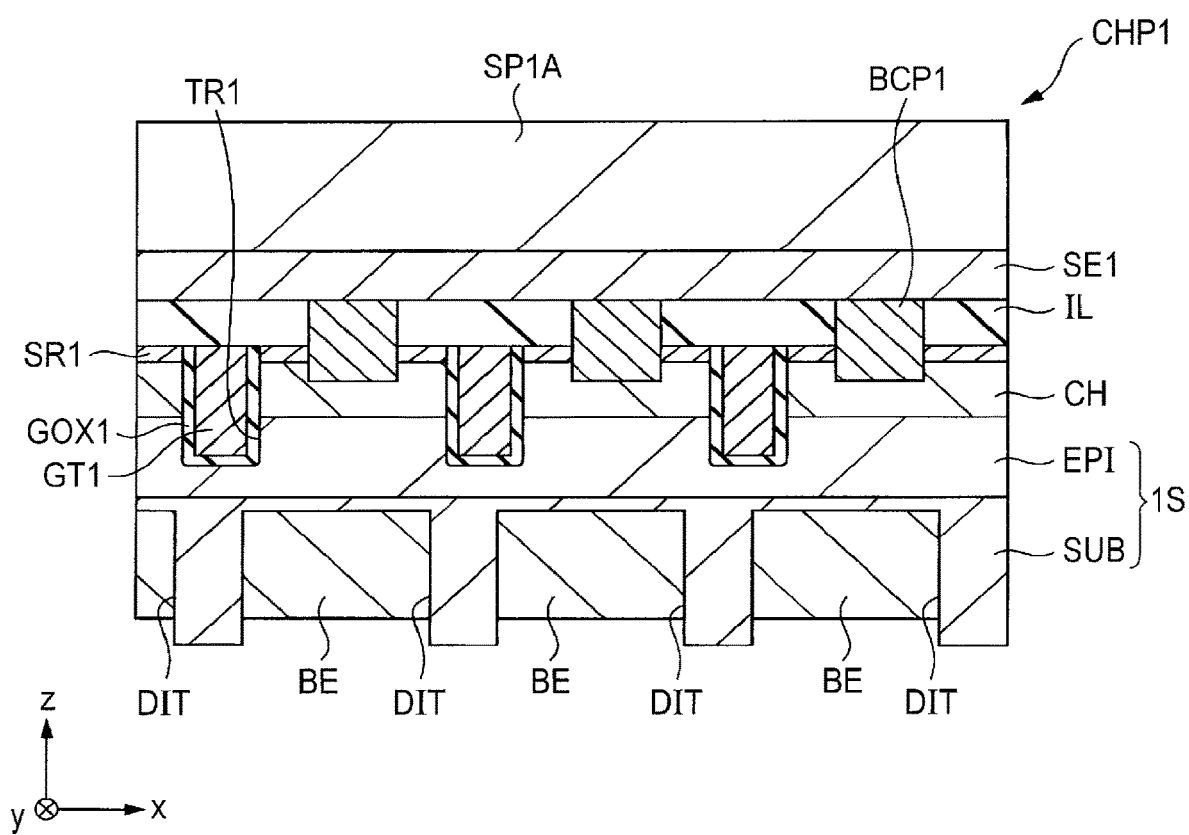
FIG. 13 is a cross-sectional view taken along line D-D of FIG. 12.

FIG. 13 is a cross-sectional view taken along line D-D of FIG. 12. In FIG. 13, in this variation, the back electrode, which is embedded in the groove DIT formed in the substrate layer SUB, extends in the y direction. At the same time, the gate GT1 and the body contact plug BCP1 also extend in the y direction. Thus, in this variation, the back electrode BE, the gate GT1, and the body contact plug BCP1 extend in parallel in the same y direction. In this point, in the embodiment shown in FIGS. 9 and 10, the gate GT1 and the body contact plug BCP1 extend in the x direction to intersect the back electrode BE extending in the y direction. From this fact, the variation is different from the embodiment in the positional relationship of the back electrode BE, the gate GT1, and the body contact plug BCP1.

Then, as shown in FIG. 13, the width of the groove DIT in the x direction intersecting the y direction is greater than the width of the body contact plug BCP1 in the x direction intersecting the extending direction (y direction) of the body contact plug BCP1. In particular, as shown in FIG. 13, the groove DIT includes the body contact plug BCP1 in a plan view.

Figure 14:
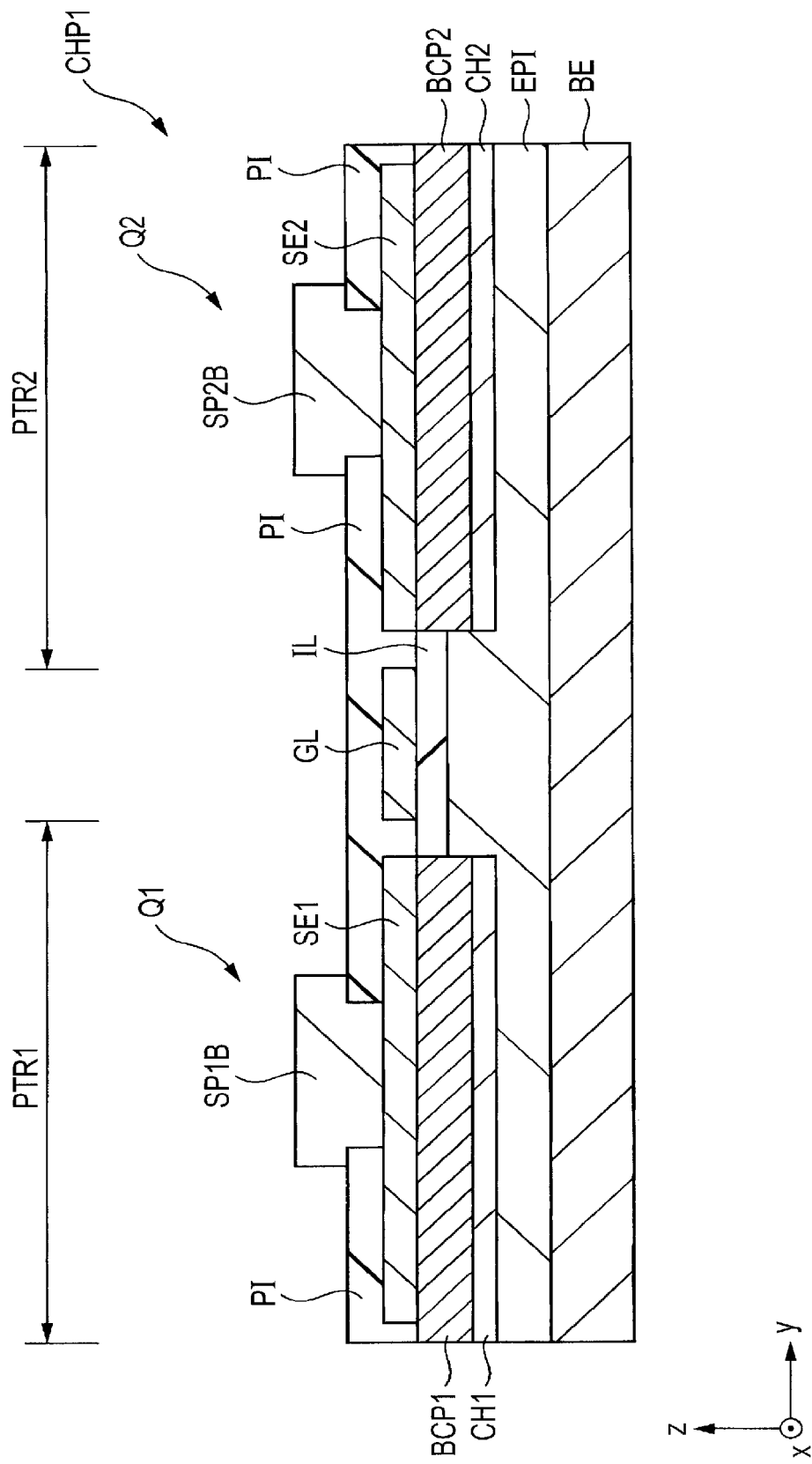
FIG. 14 is a cross-sectional view taken along line E-E of FIG. 12.

FIG. 14 is a cross-sectional view taken along line E-E of FIG. 12. As shown in FIG. 14, the back electrode BE extends in the y direction across the power transistor formation region PTR1 and the power transistor formation region PTR2. Further, it can be seen that the body contact plug BCP1 formed in the power transistor formation region PTR1 also extends in the y direction, and the body contact plug BCP2 formed in the power transistor formation region PTR2 is also extend in the y direction intersecting the x direction.

<Manufacturing Method of Semiconductor Device>

Next, the manufacturing method of a semiconductor device in the present embodiment will be described with reference to drawings. The first step is to provide a semiconductor wafer WF having a plurality of chip regions, a scribe region (cutting region) located between the chip regions, a front surface, and a back surface opposite the front surface. Note that, as shown in FIG. 5, the surface of the semiconductor wafer WF corresponds to the surface SUR of the semiconductor chip CHP obtained afterwards. On the other hand, as shown in FIG. 5, the back surface of the semiconductor wafer WF corresponds to the back surface BSUR of the semiconductor chip CHP obtained afterwards. At this time, each of the chip regions has the power transistor formation region PTR1 in which the power transistor Q1 is formed, as well as the power transistor formation region PTR2 in which the power transistor Q2 is formed. The power transistor Q2 is reversely coupled in series to the power transistor Q1 (see FIG. 8). Then, on the surface side of each of the chip regions in the provided semiconductor wafer WF (in a position closer to the front surface than the back surface), the source region SR1 and gate GT1 of the power transistor Q1 as well as the source region SR2 and gate GT2 of the power transistor Q2 are formed (see FIG. 11). More specifically, the substrate SUB having the back surface of the semiconductor wafer WF, as well as the epitaxial layer EPI formed over the substrate layer SUB are formed in the provided semiconductor wafer WF (see FIGS. 9 and 10). Then, the power transistor Q1 formed in each of the chip regions, includes: the channel layer CH1 formed in the epitaxial layer EPI; the source region SR1 contacting the channel layer CH1; and the body contact plug BCP1 that contacts the source region SR1 and reaches the channel layer CH1 (see FIG. 11). Similarly, the power transistor 2 formed in each of the chip regions, includes: the channel layer CH2 formed in the epitaxial layer EPI; the source region SR2 contacting the channel layer CH2; and the body contact plug BCP2 that contacts the source region SR2 and reaches the channel layer CH2 (see FIG. 11).

Figure 15:
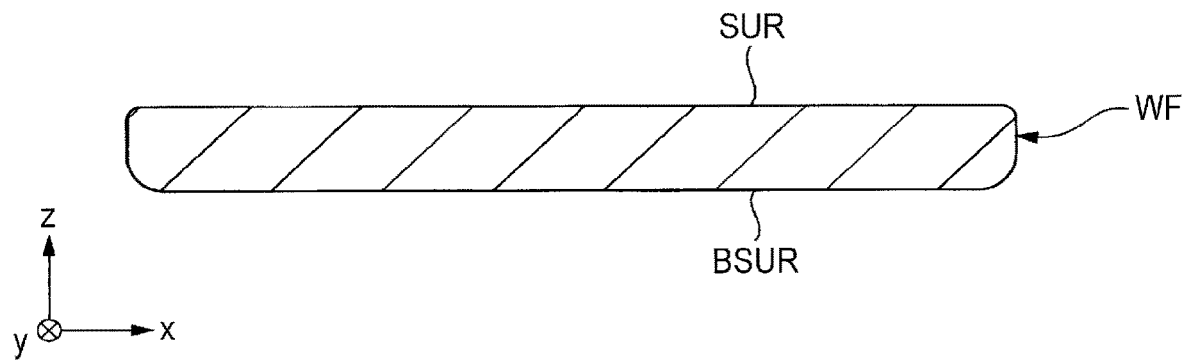
FIG. 15 is a cross-sectional view showing the manufacturing process of a semiconductor device according to the embodiment.
Figure 16:
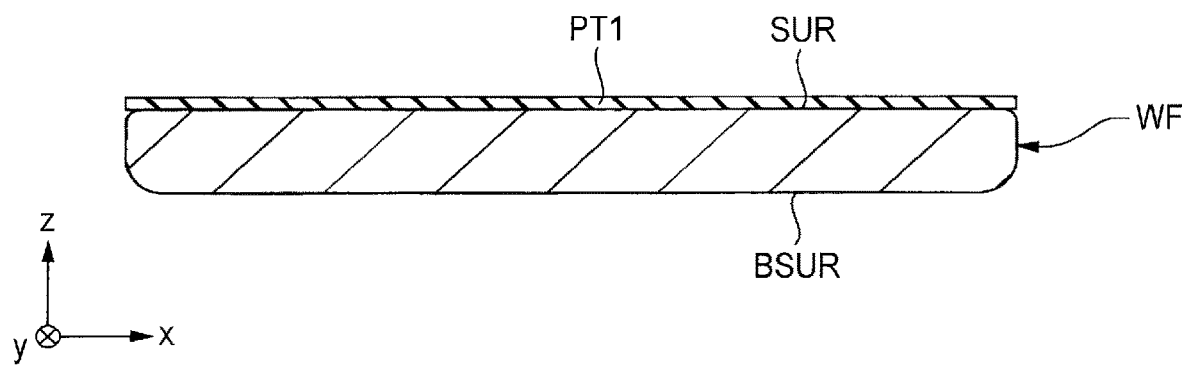
FIG. 16 is a cross-sectional view showing the manufacturing process of the semiconductor device which follows FIG. 15.
Figure 17:
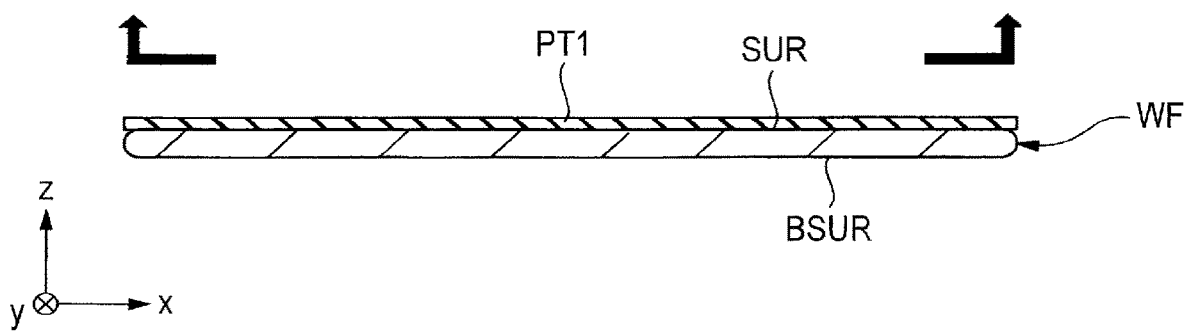
FIG. 17 is a cross-sectional view showing the manufacturing process of the semiconductor device that follows FIG. 16.
Figure 18:
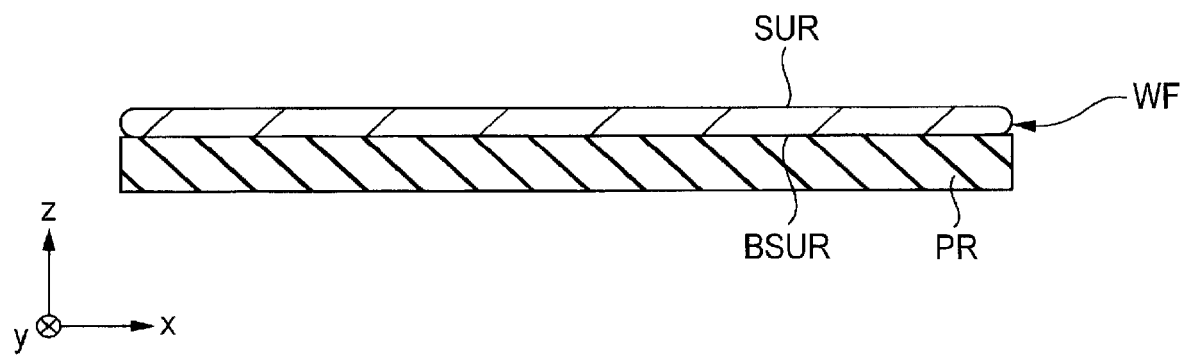
FIG. 18 is a cross-sectional view showing the manufacturing process of the semiconductor device that follows FIG. 17.

Next, an end portion on the side of the back surface BSUR of the semiconductor wafer WF is ground off as shown in FIG. 15, and then a protective tape PT1 is attached to the surface SUB of the semiconductor wafer WF as shown in FIG. 16. After that, as shown in FIG. 17, the thickness of the semiconductor wafer WF is reduced by grinding the back surface BSUR of the semiconductor wafer WF. At this time, the semiconductor wafer WF is warped in the direction of arrows due to reduction in thickness of the semiconductor wafer WF. Then, after a back surface treatment is applied to the ground back surface BSUR of the semiconductor wafer WF, a photoresist film PR is applied to the back surface BSUR of the semiconductor wafer WF as shown in FIG. 18.

Figure 19:
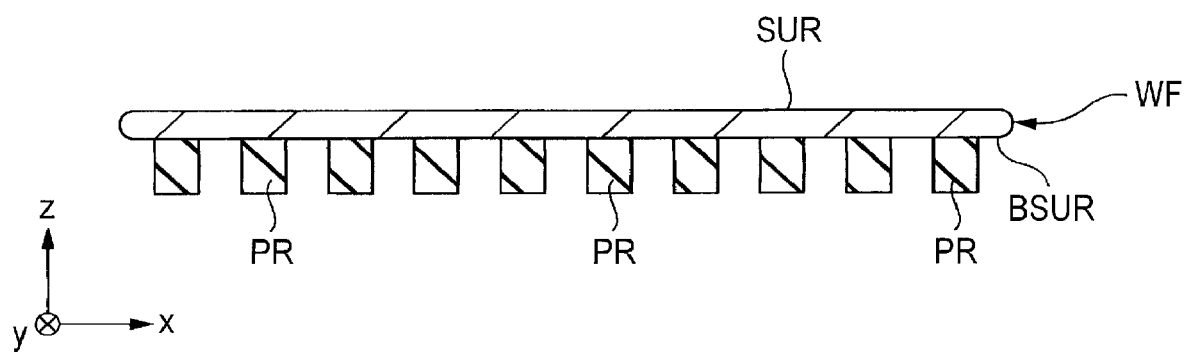
FIG. 19 is a cross-sectional view showing the manufacturing process of the semiconductor device that follows FIG. 18.
Figure 20:
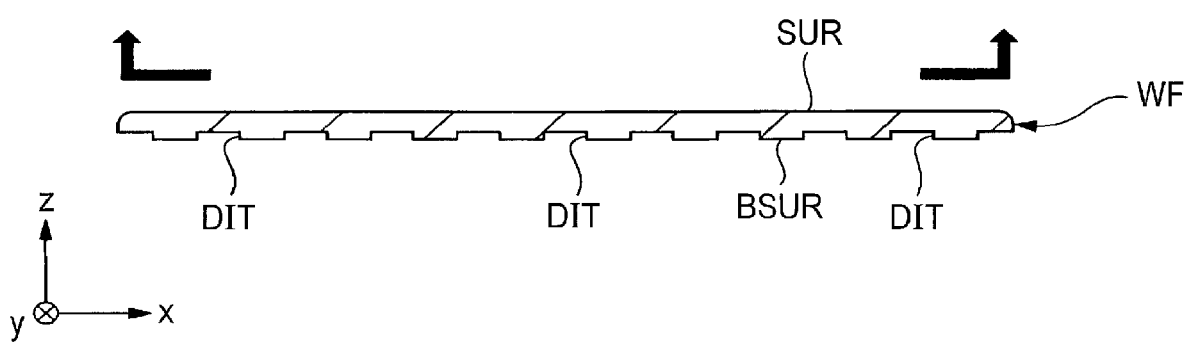
FIG. 20 is a cross-sectional view showing the manufacturing process of the semiconductor device that follows FIG. 19.

Next, as shown in FIG. 19, patterning is performed on the photoresist film PR that is applied to the back surface BSUR of the wafer WF by using the photolithography technique. Then, as shown in FIG. 20, a plurality of grooves DIT are formed in the back surface BSUR of the semiconductor wafer WF by etching with the patterned photoresist film PR as a mask. More specifically, each groove DIT extending in the y direction is formed across the power transistor formation region PTR1 and the power transistor formation region PTR2 in the back surface BSUR of the semiconductor wafer WF. At this time, the groove DIT is formed in the back surface BSUR of the semiconductor wafer WF in such a way that the bottom surface of the groove DIT is located within the substrate layer SUB. In other words, it can also be said that the groove DIT is not formed such that the bottom surface penetrates the substrate layer SUB to reach the epitaxial layer EPI. For example, the groove DIT is formed in such a way that the aspect ratio (depth/width) of the groove DIT is 1 or more. Note that the semiconductor wafer WF is warped in the direction of arrows due to reduction in thickness of the semiconductor wafer WF.

Figure 21:
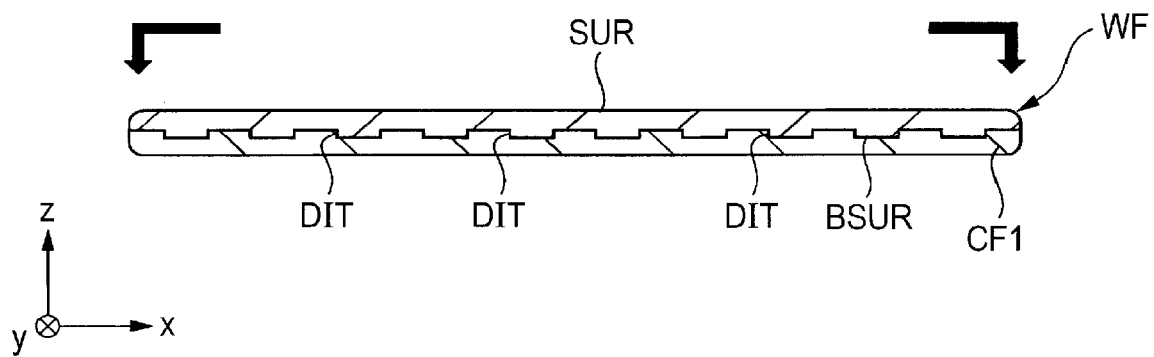
FIG. 21 is a cross-sectional view showing the manufacturing process of the semiconductor device that follows FIG. 20.

After that, as shown in FIG. 21, the conductor film CF1 is formed in the back surface BSUR of the wafer WF in which the groove DIT is formed, so that the inside of the groove DIT is filled with the conductor film CF1. The conductor film CF1 can be configured with a laminated film of barrier conductor film and silver film. At this time, the conductor film CF1 with large thickness is formed in the back surface BSR of the semiconductor wafer WF. This causes the semiconductor wafer WF to be warped in the direction of arrows.

Figure 22:
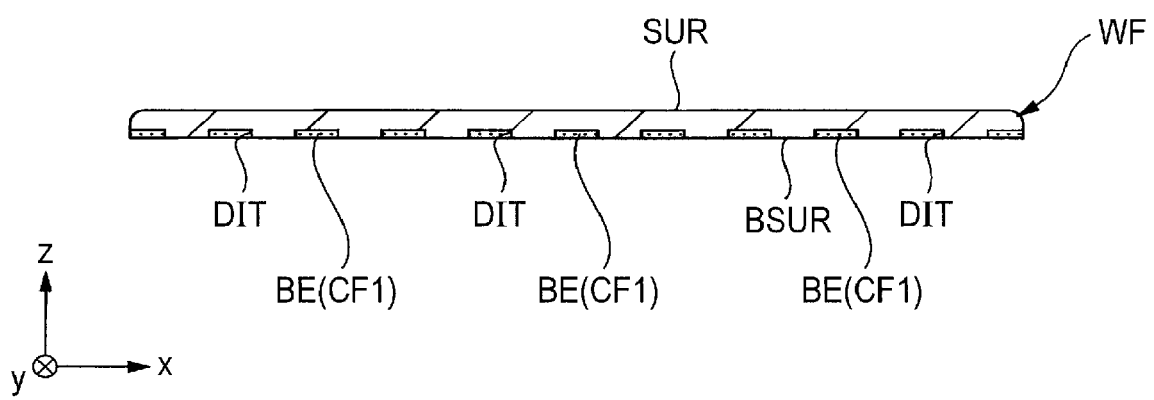
FIG. 22 is a cross-sectional view showing the manufacturing process of the semiconductor device that follows FIG. 21.

Next, as shown in FIG. 22, a portion of the conductor film CF1 that is located outside the groove DIT is removed, for example, by using an etch back method to expose the back surface BSUR of the semiconductor wafer WF. As a result, the back electrode DIT is formed of the conductor film CF1 embedded in the groove DIT. Then, the conductor film CF1 is embedded in only the inside of the groove DIT. At this time, the conductor film CF1 does not extend beyond the groove DIT, so that it is possible to reduce the occurrence of warp in the semiconductor wafer WF.

In this way, the back electrode BE, which functions as the drain electrode common to the power transistor Q1 and the power transistor Q2, is formed in the back surface of the semiconductor wafer WF.

Figure 23:
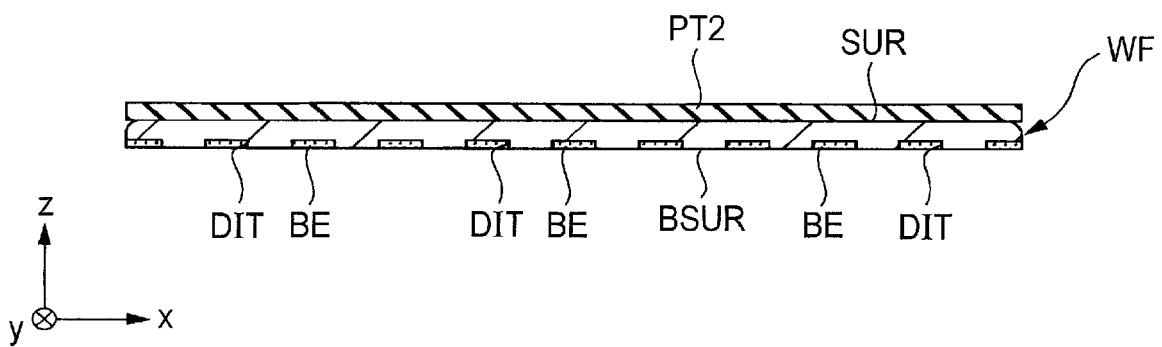
FIG. 23 is a cross-sectional view showing the manufacturing process of the semiconductor device that follows FIG. 22.
Figure 24:
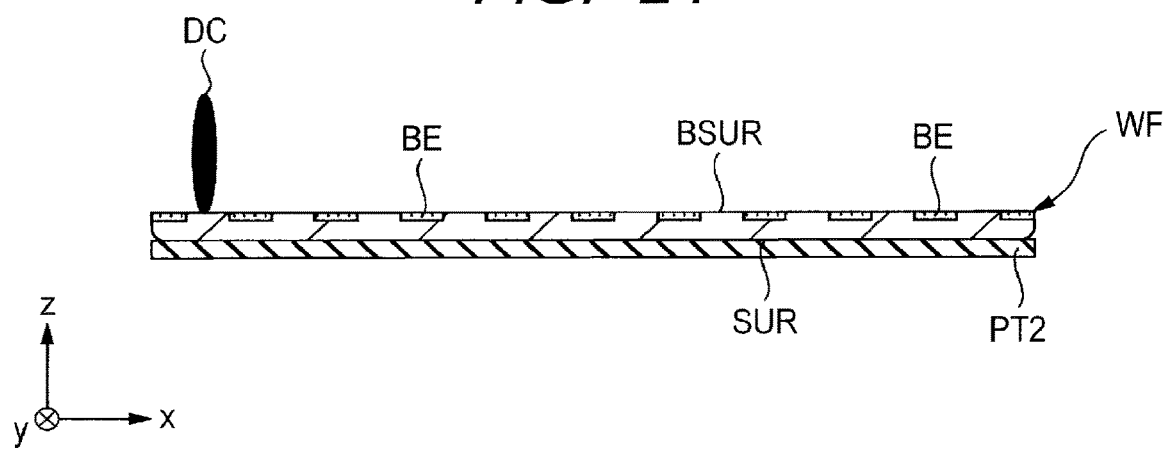
FIG. 24 is a cross-sectional view showing the manufacturing process of the semiconductor device that follows FIG. 23.

Then, after a protective tape PT2 is attached to the surface SUR of the semiconductor wafer WF as shown in FIG. 23, the semiconductor wafer WF is cut by using a dicing blade (a rotating cutting blade) DC as shown in FIG. 24. In this way, the semiconductor chip can be obtained.

Figure 25:
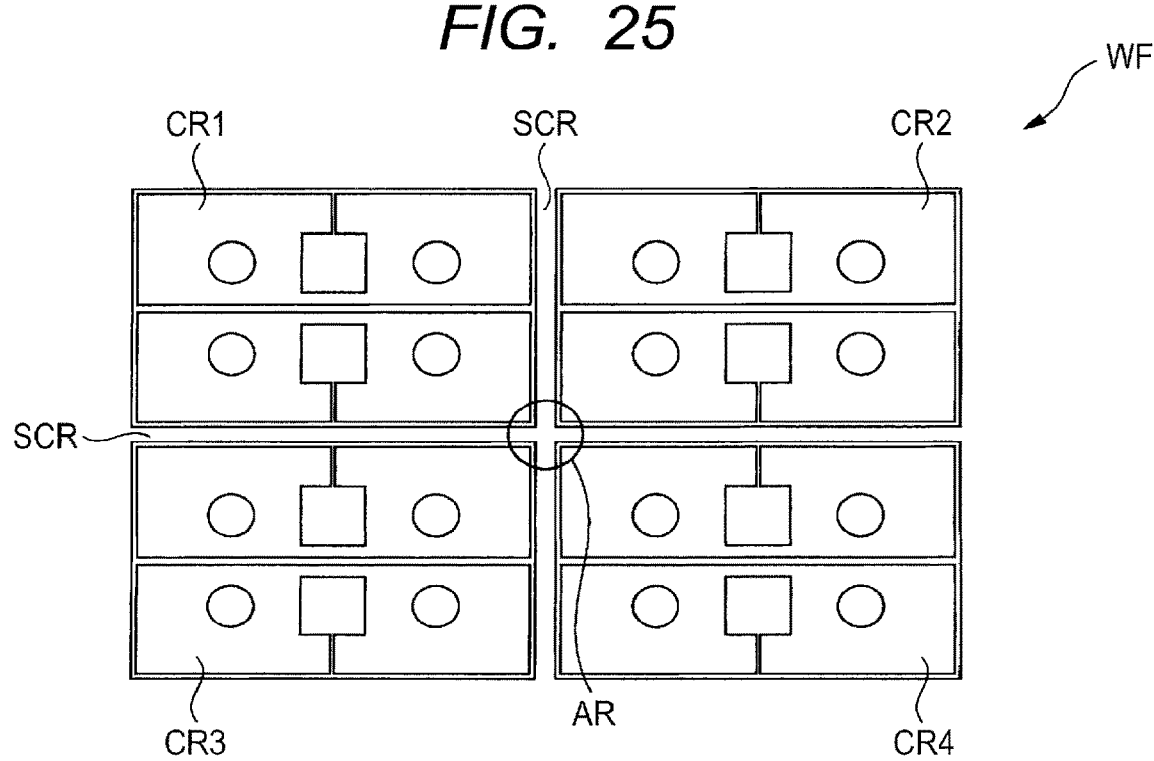
FIG. 25 is an enlarged schematic view of a portion of the semiconductor wafer.

For example, FIG. 25 is an enlarged schematic view of a part of the semiconductor wafer WF. FIG. 25 shows four chip regions CR1 to CR4 adjacent to each other. Ascribe region SCR is formed between the four chip regions CR1 to CR4. Then, in the dicing process, the chip regions CR1 to CR4 are separated from each other by cutting the scribe region SCR by using the dicing blade DC. In this way, it is possible to obtain a plurality of semiconductor chips from the semiconductor wafer WF by separating a plurality of chip regions.

Note that the term "scribe region (cutting region)" in the present embodiment is the region including the region (portion) to be cut (removed) by the dicing blade DC. In other words, a plurality of semiconductor chips may be obtained not only by cutting (removing) the entire scribe region by the dicing blade DC, but also by cutting (removing) only a portion of the scribe region by the dicing blade DC. However, in this case, a portion of the scribe region (the area not removed by the dicing blade DC) is present in the periphery of the obtained semiconductor chip.

Figure 26:
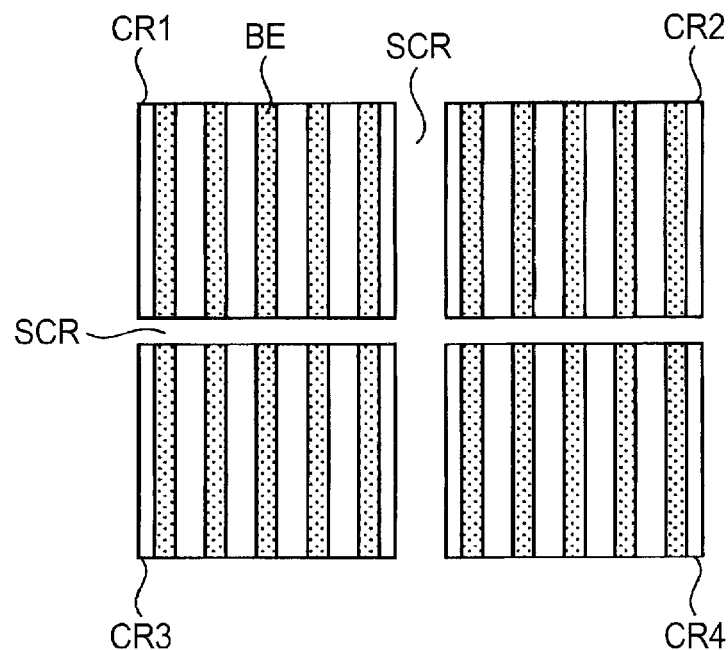
FIG. 26 is an enlarged view of a partial area of FIG. 25.

FIG. 26 is an enlarged view of an area AR of FIG. 25. As shown in FIG. 26, the back electrode BE is formed on the back surface side of the four chip regions CR1 to CR4. However, the back surface electrode BE is not formed on the back surface side of the scribe region SCR. Then, on the back surface side of the semiconductor wafer WF, the region in which the back electrode BE is not formed is the region from which the back surface of the semiconductor wafer WF is exposed. From this fact, in the present embodiment, it can be said that the scribe region SCR is included in the exposed back surface of the semiconductor wafer WF in a plan view.

Figure 27:
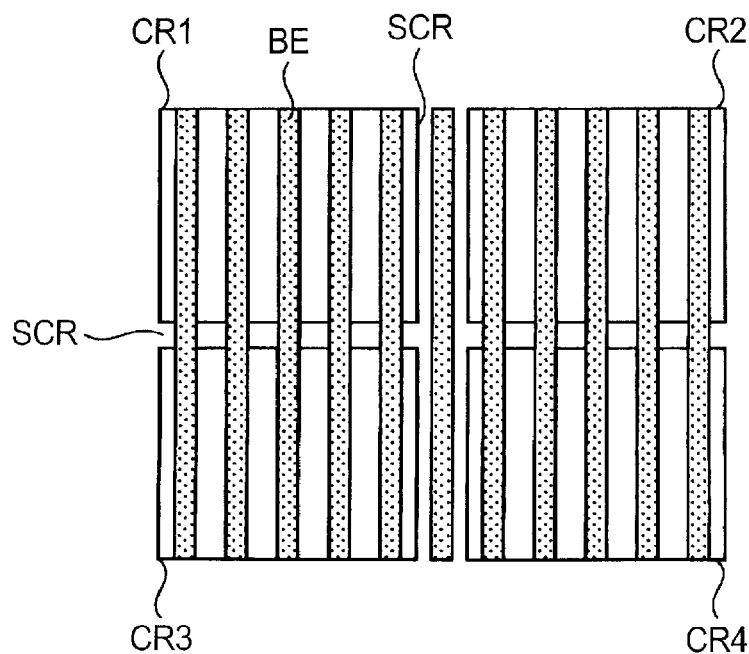
FIG. 27 is an enlarged view of a partial area of FIG. 25.

However, the present invention is not limited to the exemplary embodiment. For example, as shown in FIG. 27, it may also be possible that the back electrode BE is formed on the back surface side of the four chip regions CR1 to CR4, and at the same time, the back electrode BE is formed on the back surface side of the scribe region SCR.

Features of Embodiment

Figure 28A:
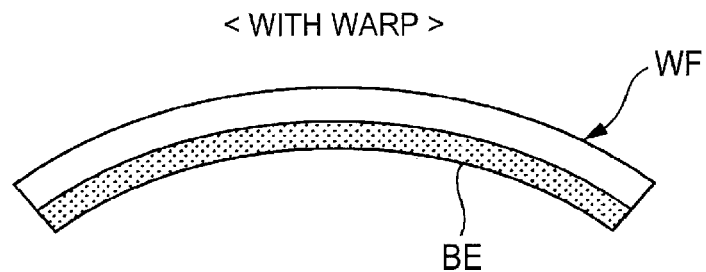
FIGS. 28A and 28B are views illustrating a technique to be compared with the embodiment.
Figure 28B:
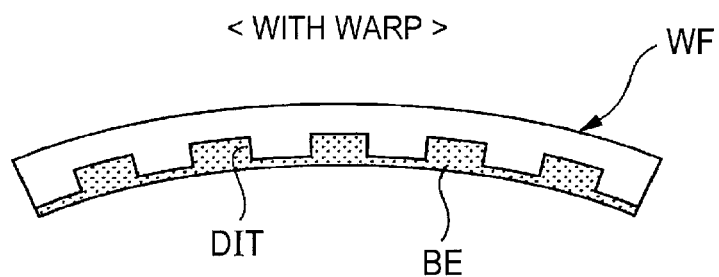
Figure 28C:
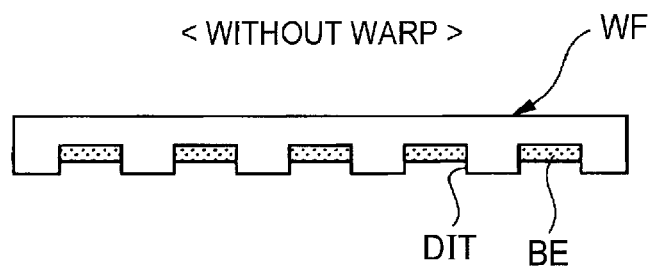
FIG. 28C is a view showing a first feature of the embodiment.

Next, features of the present embodiment are described. A first feature of the present embodiment is that, for example, as shown in FIG. 22, the back electrode BE is embedded in each of the grooves DIT formed in the back surface BSUR of the semiconductor wafer WF, and that the back surface BSUR of the semiconductor wafer WF is exposed. In this way, according to the present embodiment, it is possible to reduce the warp of the semiconductor wafer WF, which is caused by the back electrode BE formed in the back surface BSUR of the semiconductor wafer WF. For example, FIG. 28A is a schematic view showing a configuration example in which the back electrode BE is formed so as to cover the flat back surface of the semiconductor wafer WF. In the configuration shown in FIG. 28A, when the thickness of the back electrode BE formed in the back surface of the semiconductor wafer WF is increased, the semiconductor wafer WF is likely to be warped due to the difference between the main material of the semiconductor wafer WF and the constituent material of the back electrode BE. When the semiconductor wafer WF is warped, the execution of post processes such as dicing and transportation will be adversely affected and this may result in a reduction in the yield of the semiconductor device. In this regard, as shown in FIG. 28B, the following can be considered as a configuration example. A plurality of grooves DIT are formed in the back surface of the semiconductor wafer WF, in such a way that the back electrode BE is formed so as to fill all of the grooves DIT and to cover the back surface of the semiconductor wafer WF in which the grooves DIT are formed. In this configuration example, part of the back electrode BE is embedded in each of the grooves DIT formed in the back surface of the semiconductor wafer WF, and as a result, it is possible to reduce the thickness of the back electrode BE that extends beyond the groove DIT and covers the back surface of the semiconductor wafer WF. As a result, the configuration example shown in FIG. 28B can reduce the warp of the semiconductor wafer WF more than the configuration example shown in FIG. 28A. However, also in the configuration example shown in FIG. 28B, because the back surface of the semiconductor wafer WF is covered by the back electrode BE, it may be difficult to sufficiently reduce the warp of the semiconductor wafer WF. For this reason, in the present embodiment, as shown in FIG. 28C, the back electrode BE is embedded in each of the grooves DIT formed in the back surface of the semiconductor wafer WF, and at the same time, the back surface BSUR of the semiconductor wafer WF is exposed. In this way, according to the present embodiment, the back electrode BE is configured to be completely embedded inside of the groove DIT and not to extend beyond the back surface of the semiconductor wafer WF. As a result, the back surface of the wafer WF is not covered by the back electrode BE, so that it is possible to sufficiently reduce the warp of the semiconductor wafer FE caused by the back electrode BE formed in the back surface of the semiconductor wafer WF. In other words, according to the first feature of the present embodiment, because the back electrode BE is formed so as not to cover the whole back surface of the semiconductor wafer WF but is formed only in the inside of the groove DIT formed in the back surface of the semiconductor wafer WF, it is possible to reduce the warp of the semiconductor wafer WF even when the back electrode BE is formed on the back surface side of the semiconductor wafer WF. Thus, according to the first feature of the present embodiment, because the warp of the semiconductor wafer WF can be reduced, it is possible to prevent the execution of post processes such as dicing and transportation from being adversely affected by the warp of the semiconductor wafer WF. As a result, according to the present embodiment, it is possible to prevent the reduction in the manufacturing yield of the semiconductor device.

In particular, the present embodiment focuses on the semiconductor chip having a pair of power transistors that are reversely coupled in series with a drain common to each power transistor. In this semiconductor chip, the back electrode BE is used as a current path connecting the drains of the pair of power transistors. Then, the present embodiment assumes that the semiconductor chip is mounted facing down to the mounting board. In this face-down mounted semiconductor chip, it is necessary to increase the thickness of the back electrode BE in order to reduce the ON resistance of the path of the current flowing between the drains of the pair of power transistors. Thus, in the manufacturing process of the semiconductor chip to make the back electrode BE thick, the warp of the semiconductor wafer WF is likely to become a problem.

In this regard, according to the first feature of the present embodiment, for example, by deepening the depth of the groove DIT, it is possible to configure the semiconductor wafer WF so that the back surface of the semiconductor wafer WF is exposed from the back electrode BE while maintaining the thickness of the back electrode BE that is embedded in the groove DIT. As a result, according to the first feature of the present embodiment, it is possible to obtain a significant effect of reducing the warp of the semiconductor wafer WF while maintaining the thickness of the back electrode BE. In other words, the point of the first feature of the present embodiment is that, in the manufacturing process of the semiconductor chip including the power transistors reversely coupled in series to each other and being mounted facing down to the mounting board, it is possible to reduce the warp of the semiconductor wafer WF while maintaining the thickness of the back electrode BE. In other words, according to the first feature of the present embodiment, it is possible to obtain a significant effect of improving the manufacturing yield of the semiconductor device while increasing the performance of the semiconductor chip in which the thickness of the back electrode BE needs to be increased in order to reduce the ON resistance. As described above, it can be seen that the first feature of the present embodiment is a technical idea that is useful in terms of improving the manufacturing yield of the semiconductor product in which the thickness of the back electrode BE needs to be increased in order to reduce the ON resistance.

Note that upon use of the first feature of the present embodiment, it may be desirable to deepen the depth of the groove DIT in which the back electrode BE is embedded in order to reduce the ON resistance. However, if the depth of the groove DIT is excessively deepened, this could lead to an adverse effect of reducing the withstand voltage of the power transistor. Then, the idea of preventing the adverse effect of reducing the withstand voltage of the power transistor is a second feature of the present embodiment. The second feature of the present embodiment will be described below.

The point of the second feature of the present embodiment is that the groove DIT is formed so as not to reach the epitaxial layer EPI, for example, as shown in FIGS. 9 and 10. In other words, the point of the second feature of the present embodiment is that the groove DIT is formed only in the substrate layer SUB in the semiconductor substrate 1S including the substrate layer SUB and the epitaxial layer IPI formed over the substrate layer SUB. In this case, the bottom surface of the groove DIT is formed within the substrate layer SUB (including the interface with the epitaxial layer EPI). In this way, according to the present embodiment, it is possible to maintain the withstand voltage between the source and the drain of the power transistor.

Figure 29A:
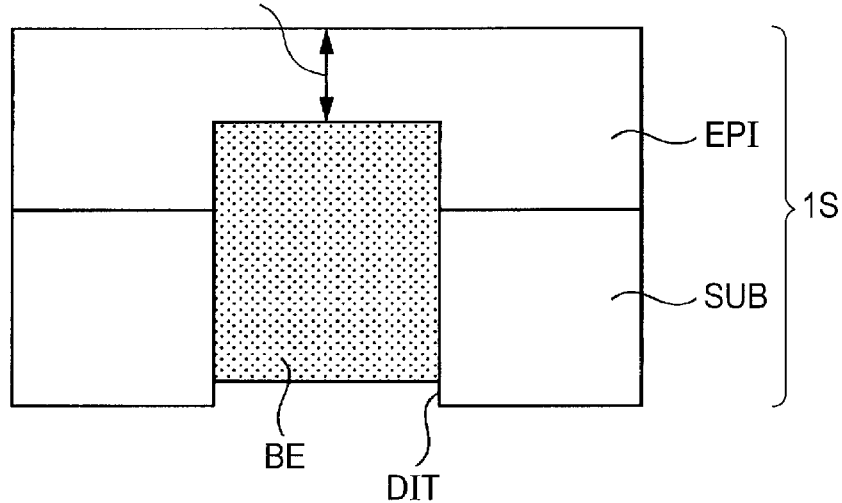
FIG. 29A is a view illustrating a technique to be compared with to the embodiment.

For example, FIG. 29A is a schematic view showing a configuration example in which the groove DIT is formed penetrating the substrate layer SUB to reach the inside of the epitaxial layer EPI, and the back electrode BE is formed so as to fill the groove DIT. As shown in FIG. 29A, it can be seen that the thickness of the epitaxial layer EPI is reduced in the region where the groove DIT is formed. The epitaxial layer EPI is formed of an n-type semiconductor layer with an impurity concentration lower than the substrate layer SUB. The epitaxial layer EPI has a function to maintain the withstand voltage between the source and the drain of the power transistor. The thickness of the epitaxial layer EPI is determined in terms of maintaining the designed withstand voltage. This means that the designed withstand voltage may not be maintained if there is a region where the thickness of the epitaxial layer EIP is less than the design value. Thus, for example, as shown in FIG. 29A, when the groove DIT is formed penetrating the substrate layer SUB to reach the inside of the epitaxial layer EPI and the back electrode BE is formed inside the groove DIT, the thickness of the epitaxial layer EPI is reduced in the region where the groove DIT is formed. As a result, the withstand voltage is reduced in this region. In other words, as shown in FIG. 29A, in the configuration example in which the groove DIT is formed to reach the epitaxial layer EPI, it may be difficult to maintain the withstand voltage.

Figure 29B:
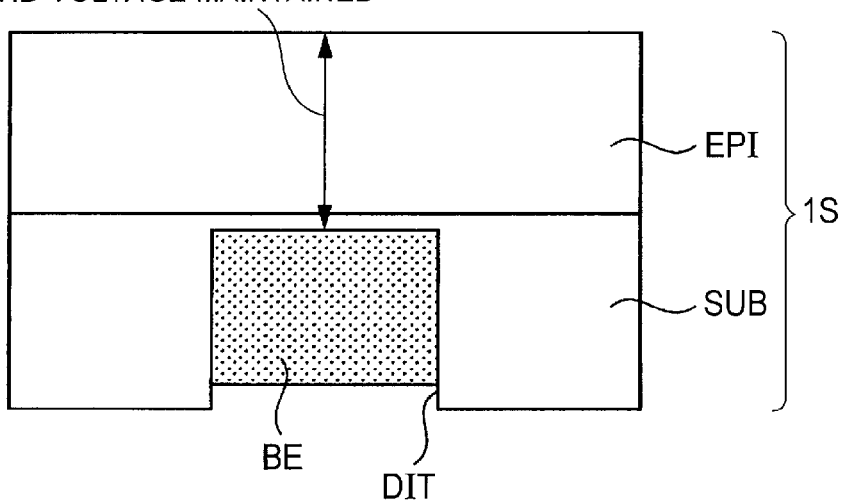
FIG. 29B is a view illustrating a second feature of the embodiment.

On the other hand, FIG. 29B is a configuration example showing the second feature of the present embodiment. More specifically, FIG. 29B shows a configuration example in which the groove DIT in which the back electrode BE is embedded only in the substrate layer SUB is formed, and the groove DIT does not reach the epitaxial layer EPI. According to the configuration example shown in FIG. 29B, there is no region where the thickness of the epitaxial layer EPI is reduced, so that it is possible to maintain the withstand voltage between the source and the drain of the power transistor. As described above, according to the second feature of the present embodiment, it is possible to increase the reliability of the semiconductor device. For example, by using the first feature of the present embodiment, it is possible to reduce the warp of the semiconductor wafer while reducing the ON resistance. In addition, by taking into account the second feature of the present embodiment, it is possible to prevent the adverse effect of reducing the withstand voltage. In other words, by taking into account the second feature of the present embodiment upon use of the first feature of the present embodiment, it is possible to improve the manufacturing yield of the semiconductor device due to the warp of the semiconductor wafer WF, while increasing the performance of the semiconductor device that is represented by the ON resistance, without causing an adverse effect of reduction of the withstand voltage.

Next, the point of a third feature of the present embodiment is that the aspect ratio (depth/width) of the groove DIT formed in the back surface of the semiconductor wafer WF is increased. In this way, it is possible to effectively reduce the occurrence of warp in the semiconductor wafer WF. For example, in terms of reducing the ON resistance, it may be desirable to increase the width of the groove (namely, to reduce the aspect ratio of the groove DIT) to increase the volume of the back electrode BE that is embedded inside of the groove DIT. However, actually, even if the width of the groove DIT is increased, the volume of the back electrode BE embedded inside of the groove DIT is not increased, but also there is a risk that the semiconductor wafer may be warped.

Figure 30A:
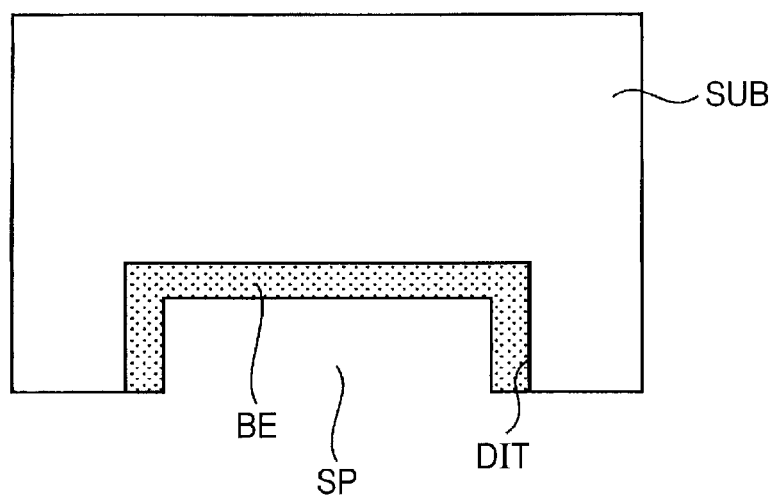
FIGS. 30A and 30B are views illustrating a technique to be compared with the embodiment.
Figure 30B:
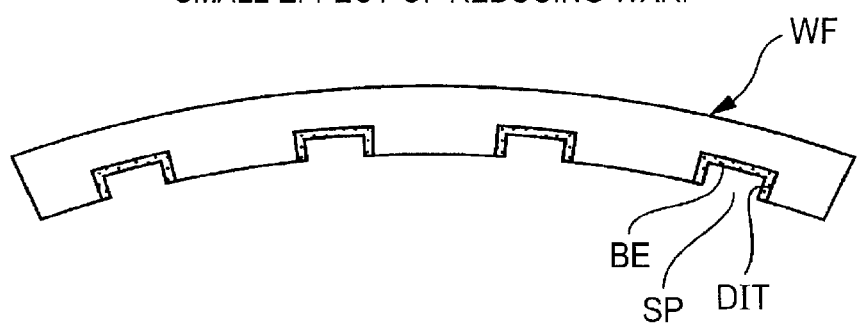

This point will be described below. FIG. 30A is a schematic view of a configuration example in which the width of the groove DIT formed in the back surface of the substrate layer SUB is increased to reduce the aspect ratio of the groove DIT. As shown in FIG. 30A, when the width of the groove DIT is increased, the back electrode BE is not formed to sufficiently fill the inside of the groove DIT, but is formed along the inner wall of the groove DIT. The reason is as follows. For example, the conductor film that configures the back electrode BE is formed by using a sputtering or plating method. In this case, the back electrode BE is not formed so as to fill the entire inside of the groove DIT if the width of the groove DIT is too wide. For this reason, when the width of the groove DIT is too wide, the back electrode BE is not embedded in the entire inside of the groove DIT, but a space SP is generated in the inside of the groove DIT. As a result, the volume of the back electrode BE formed inside the groove DIT is not increased to the size of the groove DIT, so that it is difficult to obtain an effect of reducing the ON resistance due to the increase in the volume of the back electrode BE embedded inside the groove DIT. Rather, when the space SP formed inside the groove DIT is increased, the semiconductor wafer WF is likely to be warped due to the presence of the space SP as shown in FIG. 30B. As a result, it is difficult to sufficiently obtain the effect of reducing the warp of the semiconductor wafer WF according to the first feature of the present embodiment.

Figure 31A:
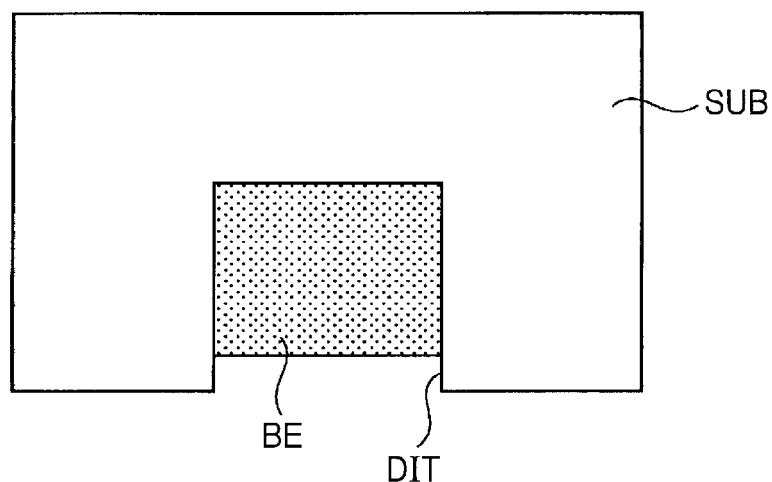
FIGS. 31A and 31B are views illustrating a third feature of the embodiment.
Figure 31B:
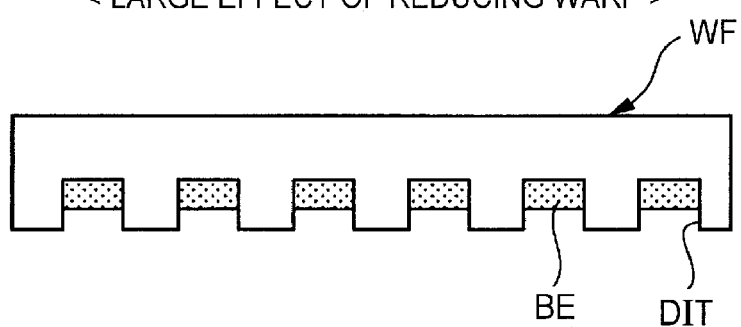

Thus, in the present embodiment, the aspect ratio of the groove DIT is increased to the extent that the space SP, which is one of the factors of occurrence of warp of the semiconductor wafer WF, is not generated in the inside of the groove DIT. In other words, the point of the third feature of the present embodiment is that the aspect ratio of the groove DIT is increased to the extent that the occurrence of warp in the semiconductor wafer WF is reduced. More specifically, FIG. 31A is a schematic view of a configuration example in which the aspect ratio of the groove DIT is increased to the extent that the inside of the groove DIT is filled with the back electrode BE. In this case, in the configuration example shown in FIG. 31A, the space SP in the configuration example shown in FIG. 30A is not present, so that it is possible to reduce the occurrence of warp in the semiconductor wafer WF, for example, as shown in FIG. 31B. As described above, the point of the third feature of the present embodiment is that the aspect ratio of the groove DIT is increased to the extent that the occurrence of warp in the semiconductor wafer WF is reduced, and for example, the aspect ratio is preferably 1 or more. In this way, according to the present embodiment, it is possible to increase the effect of reducing the occurrence of warp in the semiconductor wafer WF, which makes it possible to improve the manufacturing yield of the semiconductor device.

Figure 32:
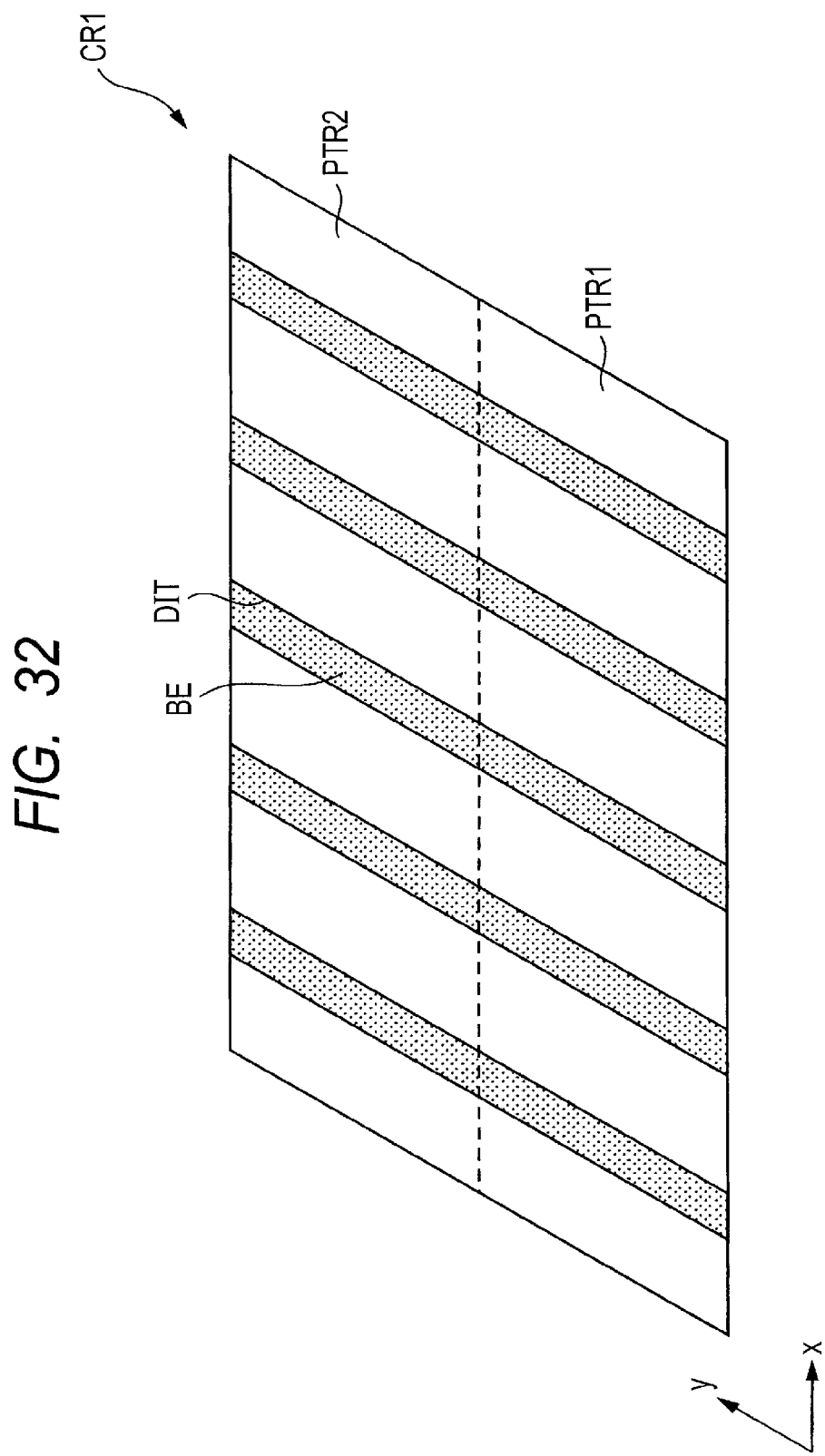
FIG. 32 is a view illustrating a fourth feature of the embodiment.

Next, a fourth feature of the present embodiment will be described. The point of the fourth feature of the present embodiment is that the groove DIT and the back electrode BE embedded in the groove DIT extend in the y direction across the power transistor formation region PTR1 and the power transistor formation region PTR2, which are formed in the chip region CR1, for example, as shown in FIG. 32. In this way, the drain of the power transistor formed in the power transistor formation region PTR1 and the drain of the power transistor formed in the power transistor formation region PTR2 can be electrically coupled by the back electrode BE embedded in the groove DIT. In other words, in the present embodiment, the back electrode BE embedded in the groove DIT is formed so as to extend in the y direction across the power transistor formation region PTR1 and the power transistor formation region PTR2. In this way, even if the semiconductor wafer is configured to expose its back surface, it is possible to electrically couple the drains of the pair of power transistors that are reversely coupled in series to each other, while exposing the back surface of the semiconductor wafer.

Further, as shown in FIG. 32, a plurality of grooves DIT extending in the y direction are arranged in the x direction and the back electrode BE is formed so as to fill each of the grooves DIT. In this way, it is possible to prevent an increase in the ON resistance of the current path connecting the drains of the pair of power transistors that are reversely coupled in series to each other. In other words, in the present embodiment, the entire back electrode BE, which is embedded in each of the grooves DIT extending in the y direction across the power transistor formation region PTR1 and the power transistor formation region PTR2, functions as the current path connecting the drains of the pair of power transistors that are reversely coupled in series to each other. Thus, the effect of reducing the ON resistance is reduced compared to the case when the back electrode BE is formed so as to cover the entire back surface of the semiconductor wafer. However, in practice, the ON resistance can be reduced to a level causing no problem. For this reason, by combining the first and fourth features of this embodiment, it is possible to obtain a significant effect of reducing the warp of the semiconductor wafer, which has an adverse effect on the manufacturing yield of the semiconductor device, while preventing increase in the ON resistance of the semiconductor device.

Next, a fifth feature of the present embodiment will be described. The point of the fifth feature of the present embodiment is that the extending direction of the back electrode embedded in the groove formed in the back surface of the semiconductor wafer, and the extending direction of the body contact plug formed on the surface side of the semiconductor wafer intersect each other. In this way, it is possible to reduce the potential for occurrence of warp in the semiconductor wafer. This point will be described below.

Figure 33:
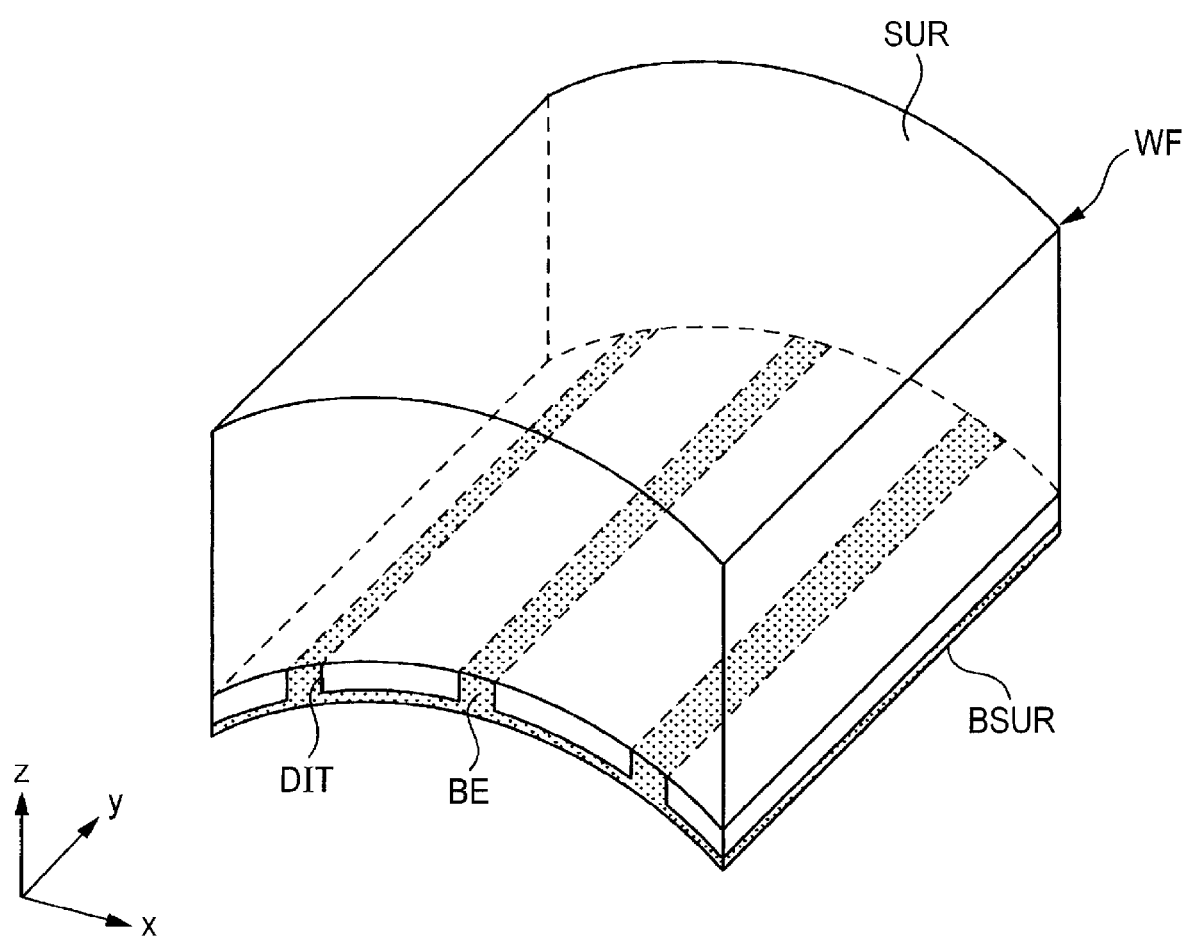
FIG. 33 is a view illustrating a fifth feature of the embodiment.

FIG. 33 is a view schematically showing the potential for occurrence of warp due to the back electrode BE formed on the side of the back surface BSUR of the semiconductor wafer WF. For example, in the present embodiment, it is possible to reduce the occurrence of warp in the semiconductor wafer WF by the first feature shown in FIG. 28C. In this regard, for example, in the configuration shown in FIG. 28B, although the groove DIT is formed in the back surface of the semiconductor wafer WF, the back surface of the semiconductor wafer WF is covered by the back electrode BE, and there is a possibility that the semiconductor wafer WF may be warped. In this case, as shown in FIG. 33, the wrap of the semiconductor wafer WF curves in the direction (x direction) intersecting the direction (y direction) in which the back electrode BE extends.

Figure 34:
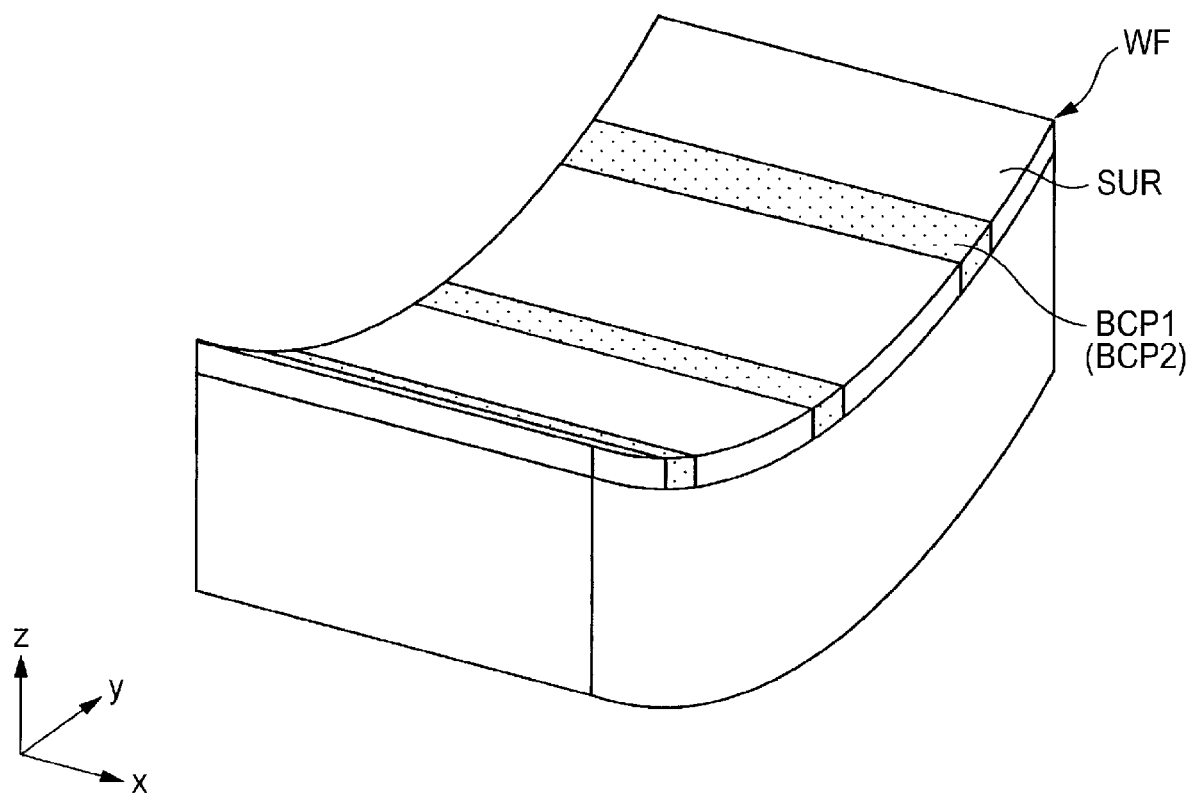
FIG. 34 is a view illustrating the fifth feature of the embodiment.

On the other hand, FIG. 34 is a view schematically showing the potential for occurrence of warp due to a body contact BP1. The body contact plug BCP1 contains tungsten and aluminum as its constituent materials that are different from silicon, which is an occurrence factor of the warp of the semiconductor wafer WF like the back electrode BE. In this case, as shown in FIG. 34, the warp of the semiconductor wafer WF curves in the direction (y direction) intersecting the direction (x direction) in which the body contact plug BCP1 extends.

Figure 35:
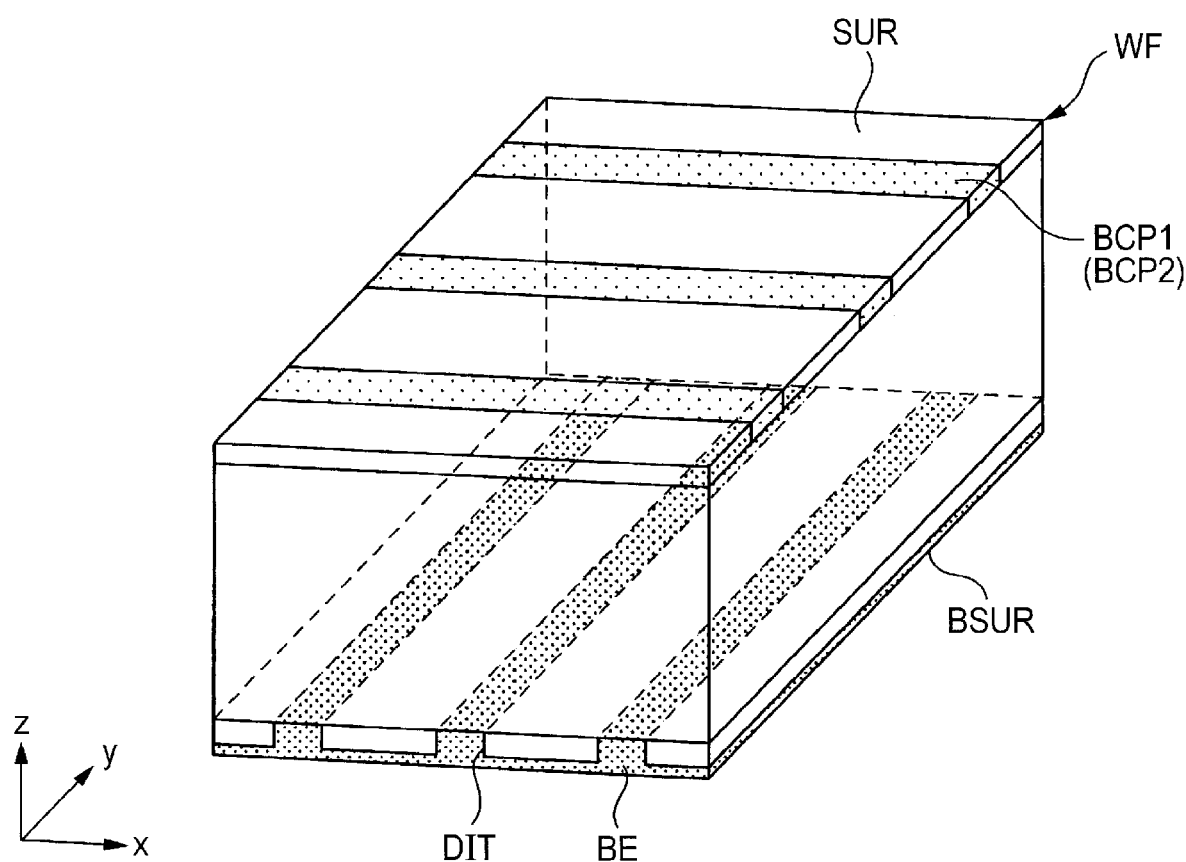
FIG. 35 is a view illustrating the fifth feature of the embodiment.

Thus, as shown in FIG. 35, the extending direction (y direction) of the back electrode BE and the extending direction (x direction) of the body contact plug BCP1 are orthogonal to each other. In this way, for example, also in the configuration having a potential for occurrence of warp shown in FIG. 28B, it is possible to reduce the potential for occurrence of warp in the semiconductor wafer WF. Because, as shown in FIGS. 33 and 34, when the extending direction (y direction) of the back electrode BE and the extending direction (x direction) of the body contact plug BCP1 intersect (at right angles) to each other, the warp in the x direction due to the back electrode BE (see FIG. 33) and the warp in the y direction due to the body contact plug BCP1 are both not likely to occur.

From the fact described above, for example, according to the fifth feature of the present embodiment, it is possible to achieve a significant effect of reducing the potential for occurrence of the warp of the semiconductor wafer WF also in the configuration shown in FIG. 28B. Note that by using the fifth feature of the present embodiment not only in the configuration shown in FIG. 28B but also in the configuration shown in FIG. 28C which is the first feature, it is possible to further reduce the potential for occurrence of the warp of the semiconductor wafer WF by the synergy effect of the first and fifth features.

Figure 36:
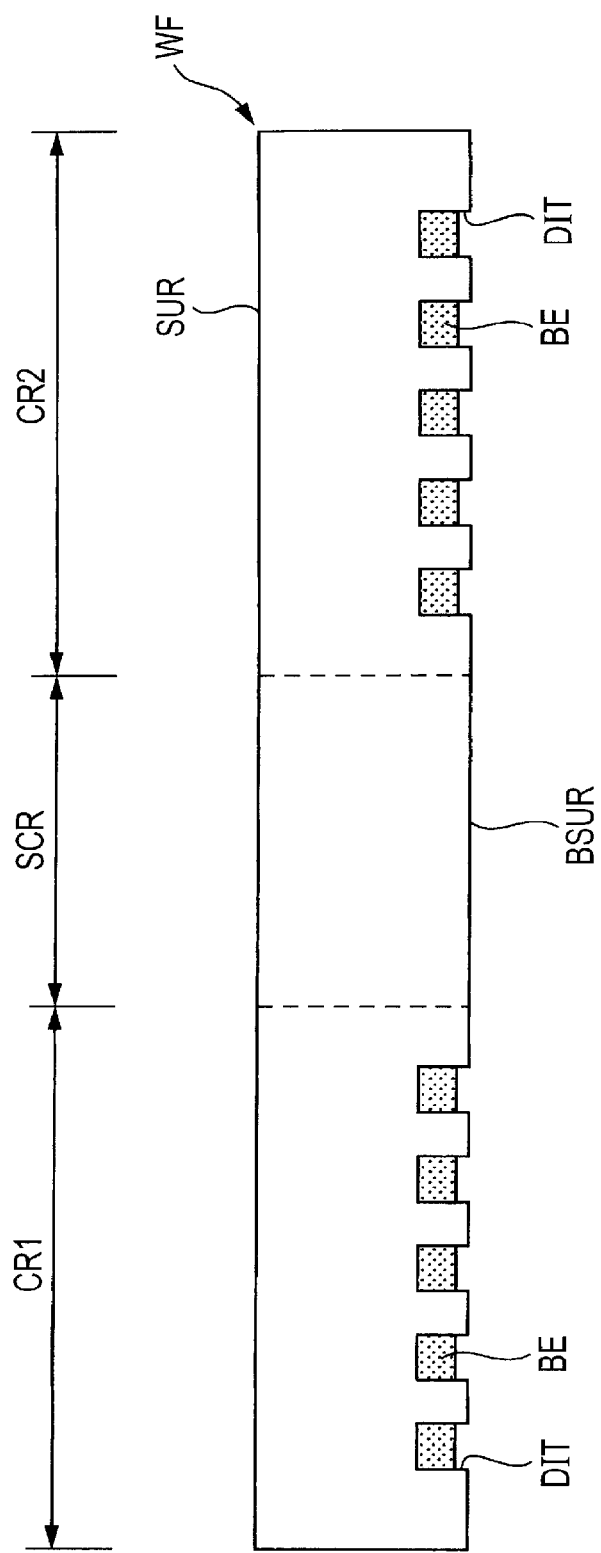
FIG. 36 is a view illustrating a sixth feature of the embodiment.

Next, a sixth feature of the present embodiment will be described. The point of the sixth feature of the present embodiment is that, for example, as shown in FIG. 36, the groove DIT and the back electrode BE embedded in the groove DIT are not formed in the back surface BSUR of the scribe region SCR of the semiconductor wafer WF. In this way, it is possible to prevent the dicing blade used for dicing from being damaged when dicing is performed on the scribe region SCR. Because, the dicing blade is intended to cut silicon which is the main material of the semiconductor wafer WF, and is not intended to cut the metal material of the back electrode BE.

Thus, for example, when the back electrode BE embedded in the groove DIT is also formed in the back surface BSUR of the scribe region SCR, if a metal material different from silicon is cut with a dicing blade for cutting silicon, clogging or other damage is likely to occur and the life of the dicing blade decreases. On the other hand, according to the sixth feature of the present embodiment, the back electrode BE is not cut with the dicing blade, so that the life of the dicing blade can be increased.

Although the invention made by the present inventors has been concretely described based on the embodiments, the present invention is not limited to the above embodiments. It is apparent to those skilled in the art that various modifications can be made without departing from the scope and principles of this invention.

What is claimed is:

1. A semiconductor device having:
    a first power transistor formation region including a front surface and a back surface side of the surface, in which a first power transistor is formed;
    a second power transistor formation region in which a second power transistor reversely coupled in series to the first power transistor is formed;
    a semiconductor substrate in which a first source of the first power transistor and a first gate of the first power transistor, a second source of the second power transistor and a second gate are respectively formed at positions closer to the front surface than the back surface; and
    a drain electrode comprised of a conductor film, which is electrically coupled to the first drain of the first power transistor and the second drain of the second power transistor,
    wherein the conductor film is formed on a back surface of the conductor substrate, and is embedded inside of a groove extending in a first direction across the first power transistor formation region and the second power transistor formation region in a plan view, and
    wherein the back surface of the semiconductor substrate is exposed from the conductor film.

2. The semiconductor device according to claim 1,
    wherein the semiconductor substrate has:
    a substrate layer including the back surface; and
    an epitaxial layer formed over the substrate layer,
    wherein the first power transistor has:
    a first channel layer formed in the epitaxial layer;
    a first source contacting the first channel layer; and
    a first body contact plug contacting the first source and reaching the first channel layer, and
    wherein the second power transistor has:
    a second channel layer formed in the epitaxial layer;
    a second source contacting the second channel layer, and
    a second body contact plug contacting the second source and reaching the second channel layer.

3. The semiconductor device according to claim 2,
    wherein the first body contact plug and the second body contact plug each extend in a second direction intersecting the first direction.

4. The semiconductor device according to claim 2,
    wherein the first body contact plug and the second body contact plug each extend in the first direction.

5. The semiconductor device according to claim 1,
    wherein the semiconductor device is configured with a semiconductor chip, and
    wherein the semiconductor chip is configured so as to be able to be mounted to a mounting substrate with the surface facing the mounting substrate.

* * * * *